(12) United States Patent
Shachal et al.

(10) Patent No.: US 9,466,458 B2
(45) Date of Patent: Oct. 11, 2016

(54) SCANNING ELECTRON MICROSCOPE

(71) Applicant: B-NANO LTD., Rehovot (IL)

(72) Inventors: Dov Shachal, Rehovot (IL); Rafi De Picciotto, Carmei Yosef (IL)

(73) Assignee: B-NANO LTD., Rehovot (IL)

( * ) Notice: Subject to any disclaimer, the term of this patent is extended or adjusted under 35 U.S.C. 154(b) by 0 days.

(21) Appl. No.: 14/768,641

(22) PCT Filed: Feb. 18, 2014

(86) PCT No.: PCT/IL2014/050175
§ 371 (c)(1),
(2) Date: Aug. 18, 2015

(87) PCT Pub. No.: WO2014/128699
PCT Pub. Date: Aug. 28, 2014

(65) Prior Publication Data
US 2015/0380207 A1    Dec. 31, 2015

Related U.S. Application Data

(60) Provisional application No. 61/766,766, filed on Feb. 20, 2013.

(51) Int. Cl.
*H01J 37/28* (2006.01)
*H01J 37/18* (2006.01)
*H01J 37/244* (2006.01)

(52) U.S. Cl.
CPC .............. *H01J 37/18* (2013.01); *H01J 37/244* (2013.01); *H01J 37/28* (2013.01); *H01J 2237/164* (2013.01); *H01J 2237/188* (2013.01); *H01J 2237/2002* (2013.01); *H01J 2237/24445* (2013.01); *H01J 2237/2605* (2013.01)

(58) Field of Classification Search
USPC ................. 250/306–307, 309, 310, 311, 313
See application file for complete search history.

(56) References Cited

U.S. PATENT DOCUMENTS

| 3,307,066 A | 2/1967 | Shapiro et al. |
| 3,517,126 A | 6/1970 | Sano et al. |
| 3,787,696 A | 1/1974 | Dao et al. |

(Continued)

FOREIGN PATENT DOCUMENTS

| EP | 0924743 | 6/1999 |
| EP | 1515358 | 3/2005 |

(Continued)

OTHER PUBLICATIONS

U.S. Appl. No. 61/100,735, filed Sep. 28, 2008.

(Continued)

*Primary Examiner* — Bernard Souw
(74) *Attorney, Agent, or Firm* — Sughrue Mion, PLLC

(57) ABSTRACT

A scanning electron microscope suitable for imaging samples in a non-vacuum environment, the scanning electron microscope including an electron source located within an enclosure maintained under vacuum, an electron permeable membrane disposed at an opening of the enclosure separating an environment within the enclosure which is maintained under vacuum and an environment outside the enclosure which is not maintained under vacuum, the electron permeable membrane not being electrically grounded and at least one non-grounded electrode operative as an electron detector.

19 Claims, 17 Drawing Sheets

(56) References Cited

U.S. PATENT DOCUMENTS

| | | | |
|---|---|---|---|
| 4,058,724 | A | 11/1977 | McKinney et al. |
| 4,591,756 | A | 5/1986 | Avnery |
| 4,721,967 | A | 1/1988 | Roche |
| 4,727,029 | A * | 2/1988 | Mori .................. G01N 1/44 435/173.4 |
| 4,992,662 | A | 2/1991 | Danilatos |
| 5,081,353 | A | 1/1992 | Yamada et al. |
| 5,391,958 | A | 2/1995 | Kelly |
| 5,406,087 | A | 4/1995 | Fujiyoshi et al. |
| 5,811,803 | A | 9/1998 | Komatsu et al. |
| 5,898,269 | A | 4/1999 | Baum et al. |
| 6,005,540 | A | 12/1999 | Shinjo et al. |
| 6,156,435 | A | 12/2000 | Gleason et al. |
| 6,188,074 | B1 | 2/2001 | Satoh et al. |
| 6,201,240 | B1 * | 3/2001 | Dotan .................. H01J 37/222 250/310 |
| 6,410,923 | B1 | 6/2002 | Crewe |
| 6,452,177 | B1 | 9/2002 | Feldman et al. |
| 6,610,980 | B2 | 8/2003 | Veneklasen et al. |
| 6,765,205 | B2 | 7/2004 | Ochiai et al. |
| 6,803,570 | B1 | 10/2004 | Bryson, III |
| 6,992,300 | B2 | 1/2006 | Moses et al. |
| 7,220,963 | B2 | 5/2007 | Gross |
| 7,399,964 | B2 | 7/2008 | Shishido et al. |
| 7,586,093 | B2 | 9/2009 | Feuerbaum |
| 7,723,682 | B2 | 5/2010 | Terada et al. |
| 8,164,057 | B2 * | 4/2012 | Shachal .................. H01J 37/20 250/306 |
| 8,334,510 | B2 * | 12/2012 | Shachal .................. G01N 23/22 250/310 |
| 8,492,716 | B2 | 7/2013 | Shachal et al. |
| 8,779,358 | B2 * | 7/2014 | Shachal .................. H01J 37/20 250/306 |
| 8,981,294 | B2 * | 3/2015 | Shachal .................. H01J 37/28 250/306 |
| 9,076,631 | B2 | 7/2015 | Shachal |
| 9,159,527 | B2 * | 10/2015 | Ward .................. H01J 27/26 |
| 2002/0047095 | A1 | 4/2002 | Morishige et al. |
| 2003/0077530 | A1 | 4/2003 | Fujiwara et al. |
| 2003/0132382 | A1 | 7/2003 | Sogard |
| 2003/0168595 | A1 | 9/2003 | Danilatos |
| 2003/0178576 | A1 | 9/2003 | Pan et al. |
| 2004/0046120 | A1 | 3/2004 | Moses et al. |
| 2004/0188611 | A1 | 9/2004 | Takeuchi et al. |
| 2004/0217297 | A1 | 11/2004 | Moses et al. |
| 2005/0092935 | A1 | 5/2005 | Demos et al. |
| 2005/0173632 | A1 | 8/2005 | Behar et al. |
| 2005/0178966 | A1 | 8/2005 | Gross |
| 2006/0012785 | A1 | 1/2006 | Funk et al. |
| 2006/0033038 | A1 | 2/2006 | Moses et al. |
| 2006/0169910 | A1 | 8/2006 | Frosien et al. |
| 2006/0231773 | A1 | 10/2006 | Katagiri et al. |
| 2006/0284093 | A1 | 12/2006 | Kamiya et al. |
| 2006/0284108 | A1 | 12/2006 | Buijsse et al. |
| 2007/0194225 | A1 | 8/2007 | Zorn |
| 2007/0210253 | A1 | 9/2007 | Behar et al. |
| 2010/0140470 | A1 | 6/2010 | Shachal |
| 2011/0168889 | A1 * | 7/2011 | Shachal .................. G01N 23/22 250/307 |
| 2011/0210247 | A1 * | 9/2011 | Shachal .................. H01J 37/16 250/307 |
| 2012/0241608 | A1 | 9/2012 | Shachal |
| 2014/0117232 | A1 | 5/2014 | Shachal et al. |
| 2014/0361166 | A1 | 12/2014 | Shachal |
| 2015/0235806 | A1 * | 8/2015 | Shachal .................. H01J 37/28 250/307 |
| 2015/0243475 | A1 * | 8/2015 | Shachal .................. H01J 37/28 463/19 |

FOREIGN PATENT DOCUMENTS

| | | |
|---|---|---|
| EP | 1796132 | 6/2007 |
| EP | 2372743 | 10/2011 |
| JP | 1976-110964 | 9/1976 |
| JP | 1988-81742 | 4/1988 |
| JP | 1993-225937 | 9/1993 |
| JP | 1994-28993 | 2/1994 |
| JP | 2000/131045 | 5/2000 |
| JP | 2002-093358 | 3/2002 |
| JP | 2003-229083 | 8/2003 |
| JP | 2003-254919 | 9/2003 |
| JP | 2006-147430 | 6/2006 |
| JP | 2006-294481 | 10/2006 |
| JP | 2007-095335 | 4/2007 |
| JP | 2007-157682 | 6/2007 |
| JP | 2007-294328 | 11/2007 |
| JP | 2007-305499 | 11/2007 |
| WO | 89/01698 | 2/1989 |
| WO | 96/03767 | 2/1996 |
| WO | 2008/050321 | 5/2008 |
| WO | 2010/001399 | 1/2010 |
| WO | 2010/035265 | 4/2010 |
| WO | 2012/007941 | 1/2012 |
| WO | 2013/183057 | 12/2013 |
| WO | 2014/128699 | 8/2014 |

OTHER PUBLICATIONS

An International Preliminary Report on Patentability dated Mar. 29, 2011, which issued during the prosecution of Applicant's PCT/IL09/000926.

U.S. Appl. No. 60/862,631, filed Oct. 24, 2006.

Supplementary European Search Report dated Mar. 6, 2012, which issued during the prosecution of Applicant's European App No. 09815770.

An Office Action dated Feb. 15, 2013, which issued during the prosecution of U.S. Appl. No. 13/449,392.

European Search Report dated Nov. 21, 2011 which issued during the prosecution of Applicant's European App No. 07827239.0.

An International Search Report dated Nov. 18, 2009, which issued during the prosecution of Applicant's PCT/IL09/00660.

An International Preliminary Report on Patentability dated Dec. 9, 2014, which issued during the prosecution of Applicant's PCT/IL2013/050489.

An International Preliminary Report on Patentability dated Aug. 25, 2015, which issued during the prosecution of Applicant's PCT/IL2014/050175.

An International Search Report and a Written Opinion both dated Jun. 2, 2014, which issued during the prosecution of Applicant's PCT/IL2014/050175.

An International Search Report and a Written Opinion both dated Sep. 27, 2013, which issued during the prosecution of Applicant's PCT/IL2013/050489.

U.S. Appl. No. 61/655,567, filed Jun. 5, 2012.
U.S. Appl. No. 61/077,955, filed Jul. 3, 2008.
U.S. Appl. No. 61/077,977, filed Jul. 3, 2008.
U.S. Appl. No. 61/077,981, filed Jul. 3, 2008.
U.S. Appl. No. 61/077,970, filed Jul. 3, 2008.
U.S. Appl. No. 61/766,766, filed Feb. 20, 2013.

An International Search Report dated Jan. 26, 2010, which issued during the prosecution of Applicant's PCT/IL09/00926.

MacLaren S. A.: "Development of an External Beam Ion Milliprobe", United States Naval Academy, 1990.

Notice of Allowance dated Dec. 30, 2011, which issued during the prosecution of U.S. Appl. No. 12/446,757.

Notice of Allowance dated Jul. 30, 2012, which issued during the prosecution of U.S. Appl. No. 13/002,448.

Notice of Allowance dated Mar. 12, 2014, which issued during the prosecution of U.S. Appl. No. 13/449,392.

Notice of Allowance dated Nov. 12, 2014, which issued during the prosecution of U.S. Appl. No. 13/663,684.

Notice of Allowance dated Jan. 22, 2015, which issued during the prosecution of U.S. Appl. No. 14/302,221.

Notice of Allowance dated Nov. 4, 2015, which issued during the prosecution of U.S. Appl. No. 14/687,890.

An Office Action dated Jun. 5, 2015 which issued during the prosecution of Applicant's European App No. 07827239.0.

An Office Action dated Feb. 6, 2014, which issued during the prosecution of Applicant's European App No. 07827239.0.

(56) References Cited

OTHER PUBLICATIONS

Notice of Allowance dated May 6, 2013, which issued during the prosecution of U.S. Appl. No. 13/120,344.
An English translation of an Office Action dated Jan. 28, 2015, which issued during the prosecution of Chinese Patent Application No. 200980142967.0.
An English translation of an Office Action dated Nov. 27, 2012, which issued during the prosecution of Chinese Patent Application No. 200980142967.0.
An English translation of an Office Action dated May 30, 2013, which issued during the prosecution of Chinese Patent Application No. 200980142967.0.
An English translation of an Office Action dated Feb. 27, 2014, which issued during the prosecution of Chinese Patent Application No. 200980142967.0.
An English translation of an Office Action dated Aug. 20, 2014, which issued during the prosecution of Chinese Patent Application No. 200980142967.0.
An English translation of an Office Action dated Apr. 1, 2014, which issued during the prosecution of Japanese Patent Application No. 528494-2011.
An English translation of an Office Action dated May 28, 2013, which issued during the prosecution of Japanese Patent Application No. 528494-2011.
An English translation of an Office Action dated Feb. 17, 2015, which issued during the prosecution of Japanese Patent Application No. 528494-2011.
An Office Action dated May 12, 2014, which issued during the prosecution of Applicant's European App No. 09815770.4.
An Office Action dated Jun. 7, 2013, which issued during the prosecution of U.S. Appl. No. 13/449,392.
An Office Action dated Jul. 31, 2014, which issued during the prosecution of U.S. Appl. No. 13/663,684.
An Office Action dated Feb. 4, 2014, which issued during the prosecution of U.S. Appl. No. 13/663,684.
An Office Action dated Sep. 19, 2014, which issued during the prosecution of U.S. Appl. No. 14/302,221.
An Office Action dated Oct. 18, 2012, which issued during the prosecution of U.S. Appl. No. 13/120,344.
An Office Action dated Jul. 22, 2011, which issued during the prosecution of U.S. Appl. No. 12/446,757.
An Office Action dated Dec. 4, 2015, which issued during the prosecution of U.S. Appl. No. 14/615,013.

* cited by examiner

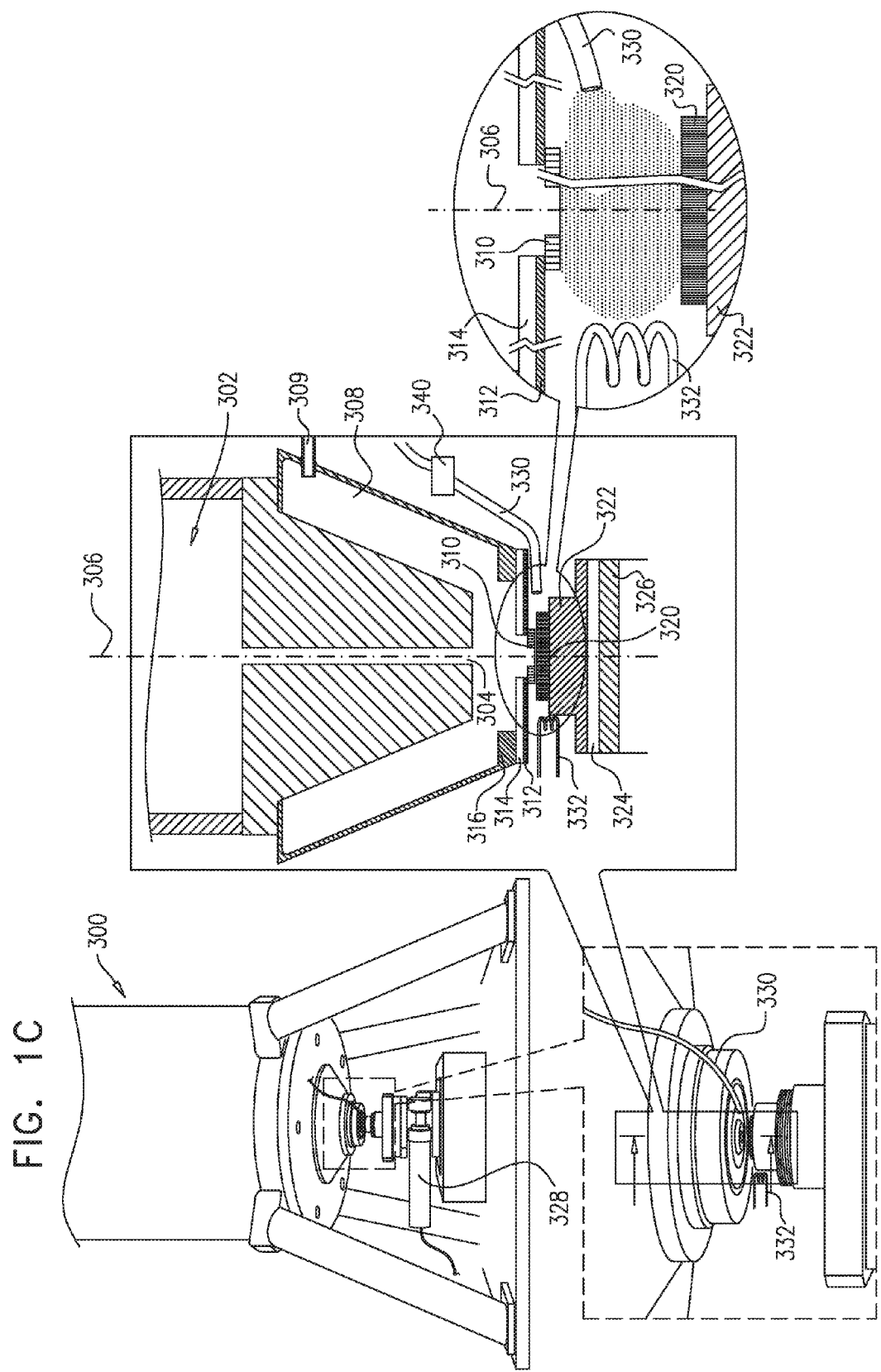

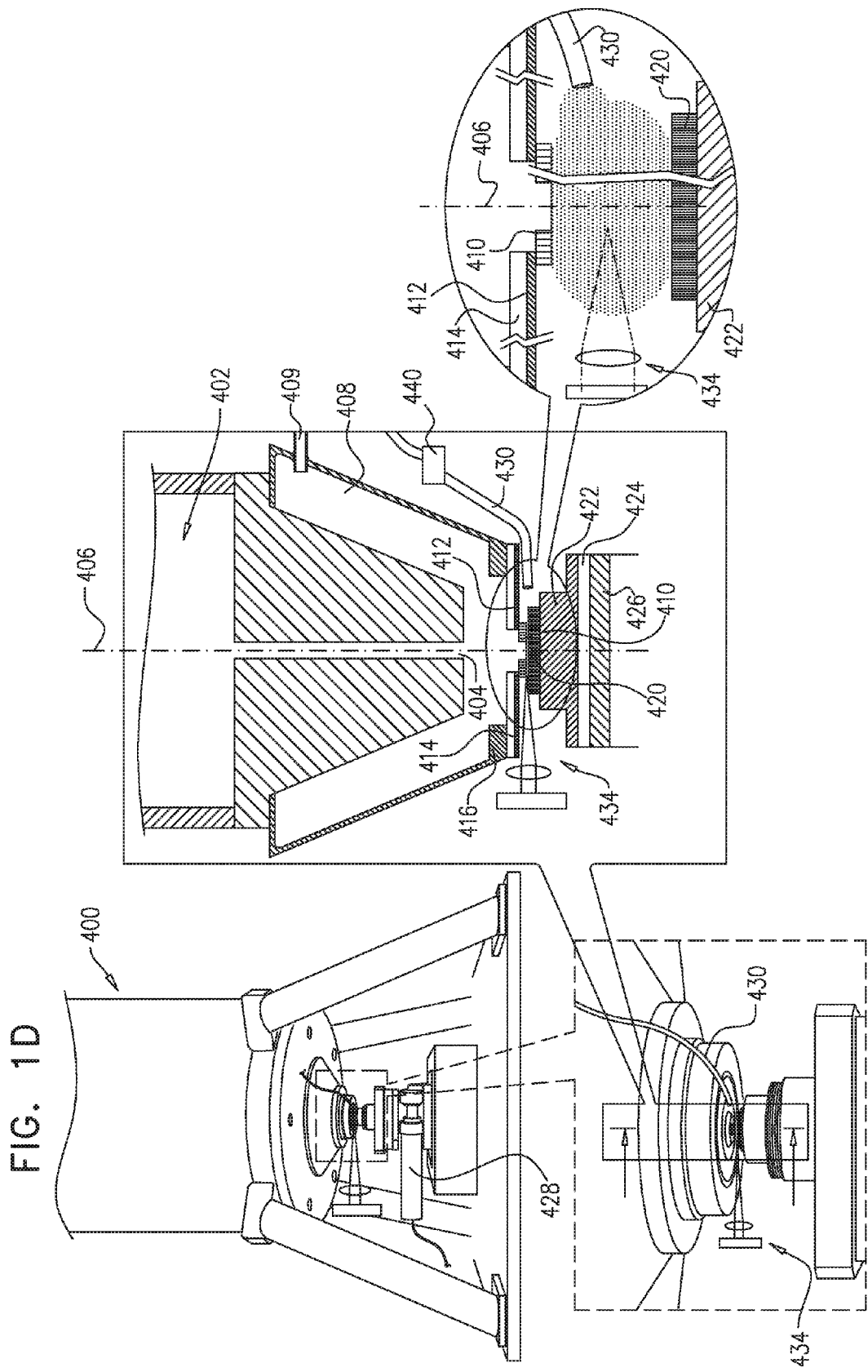

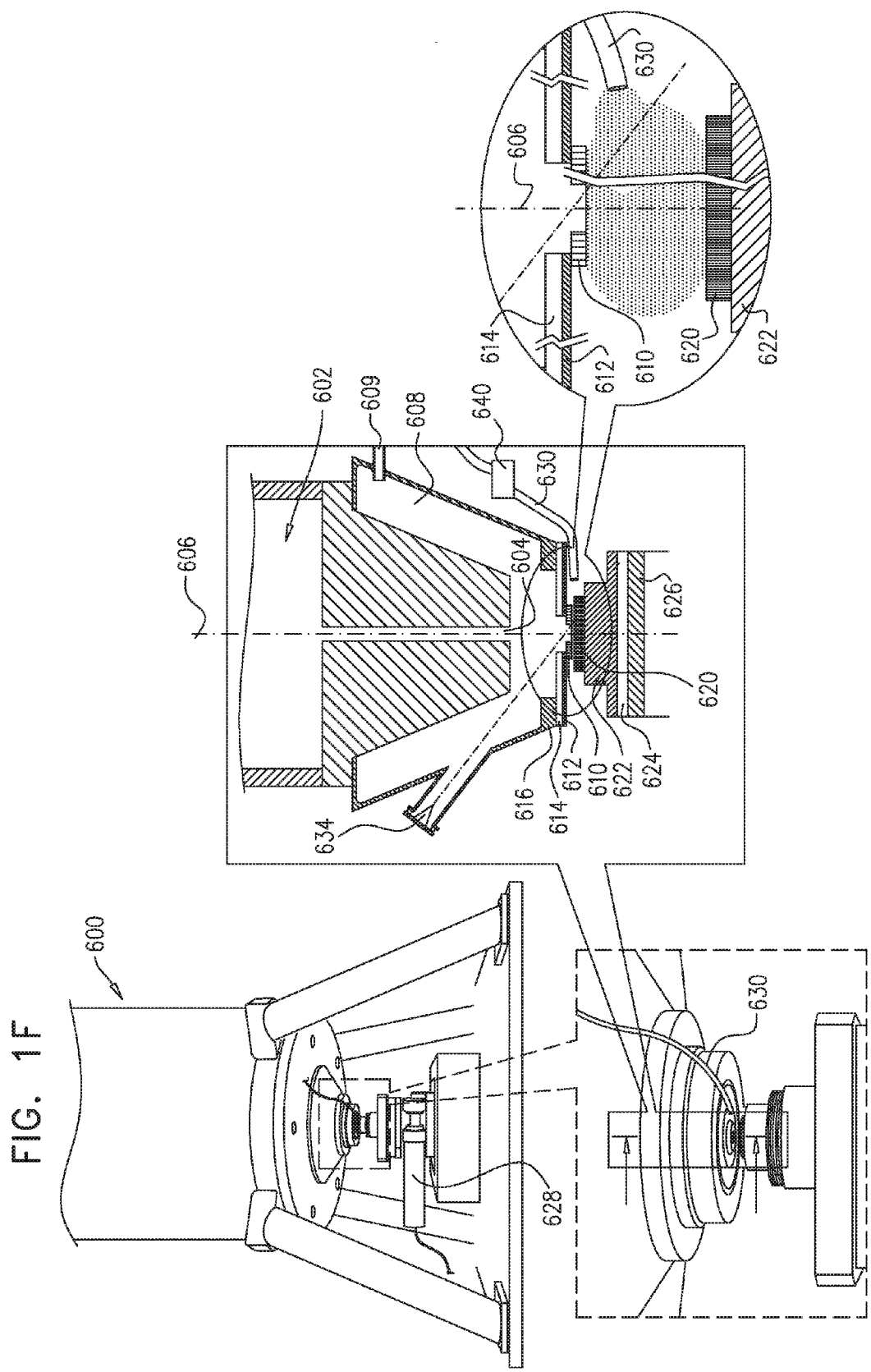

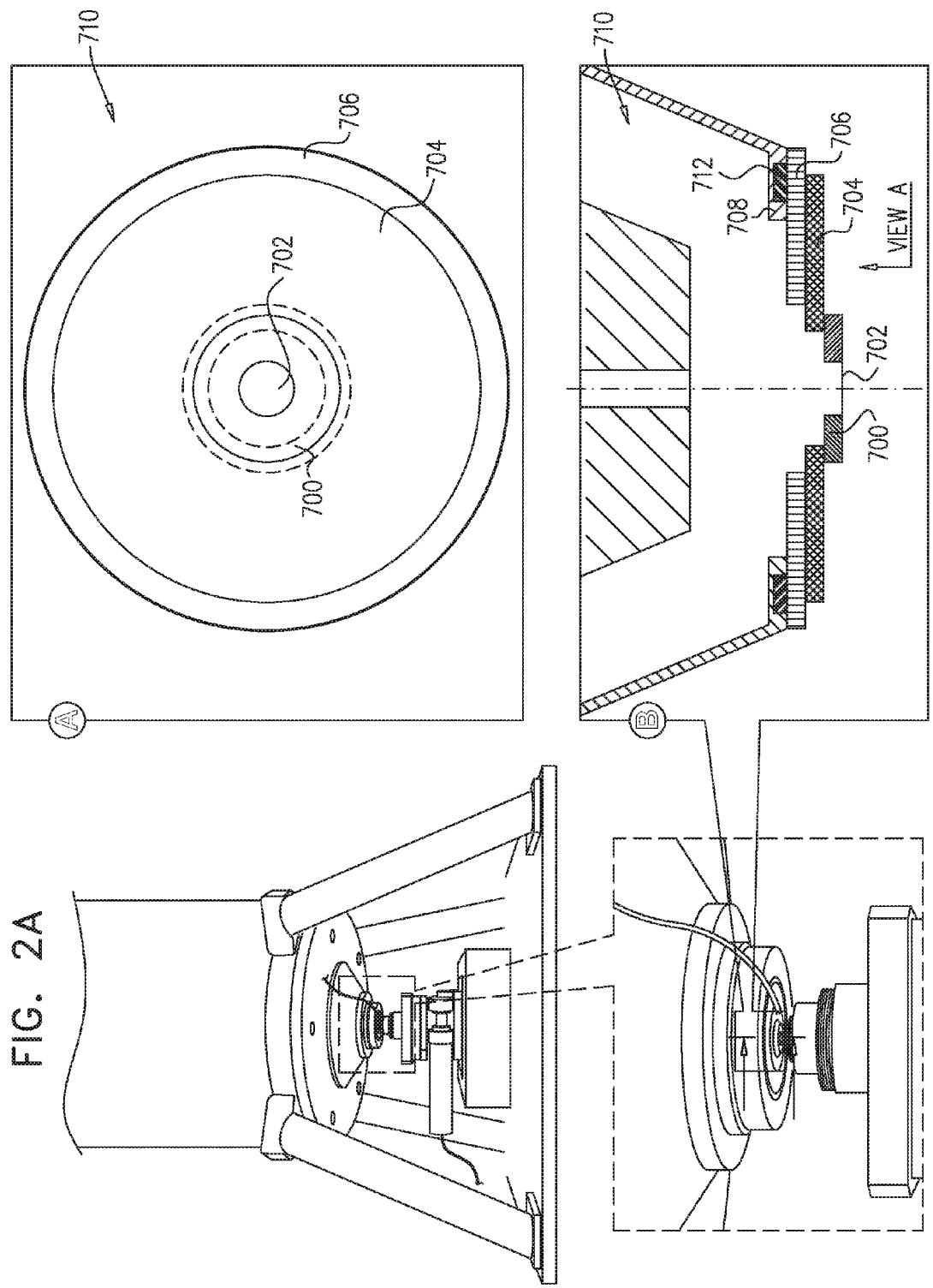

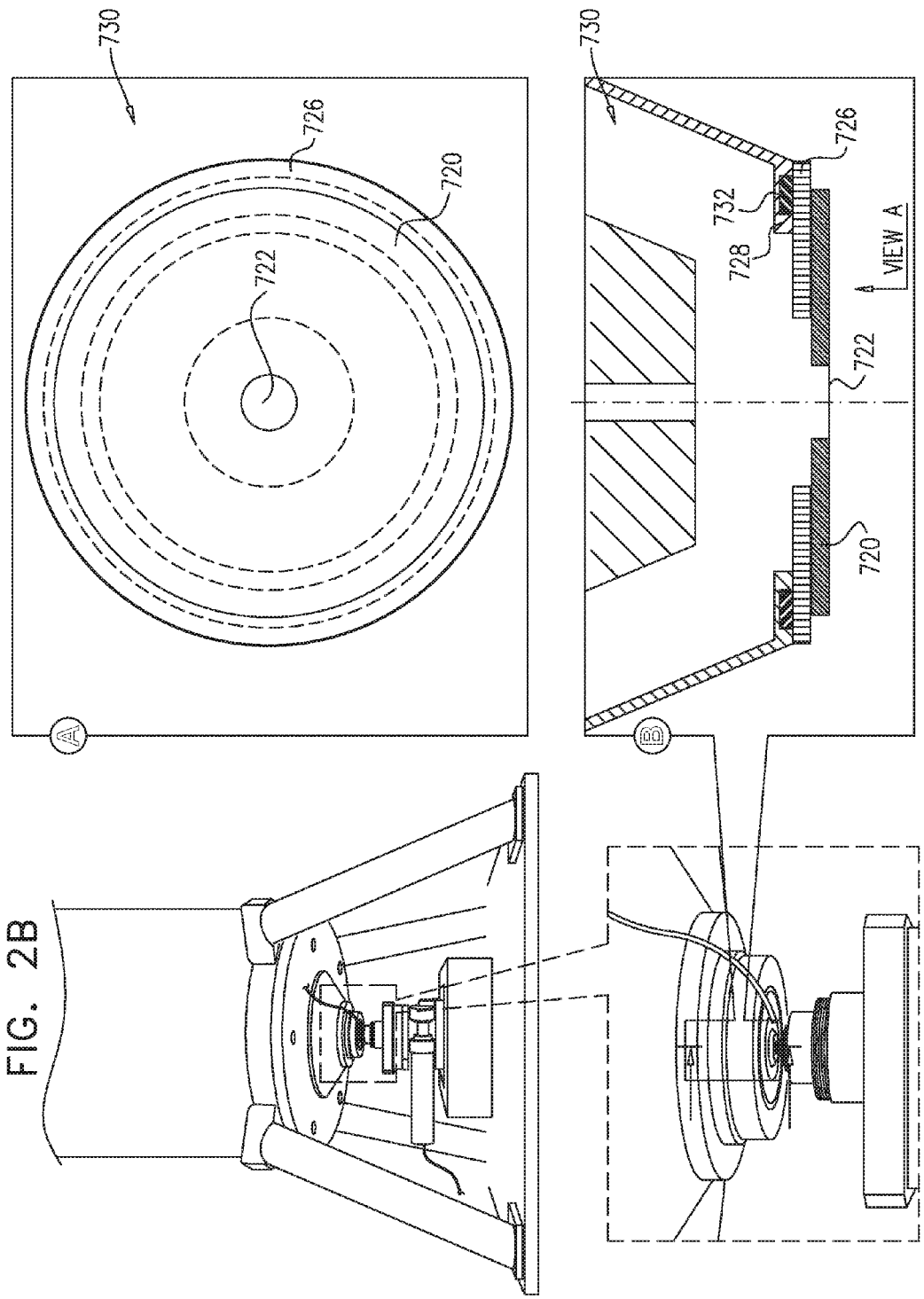

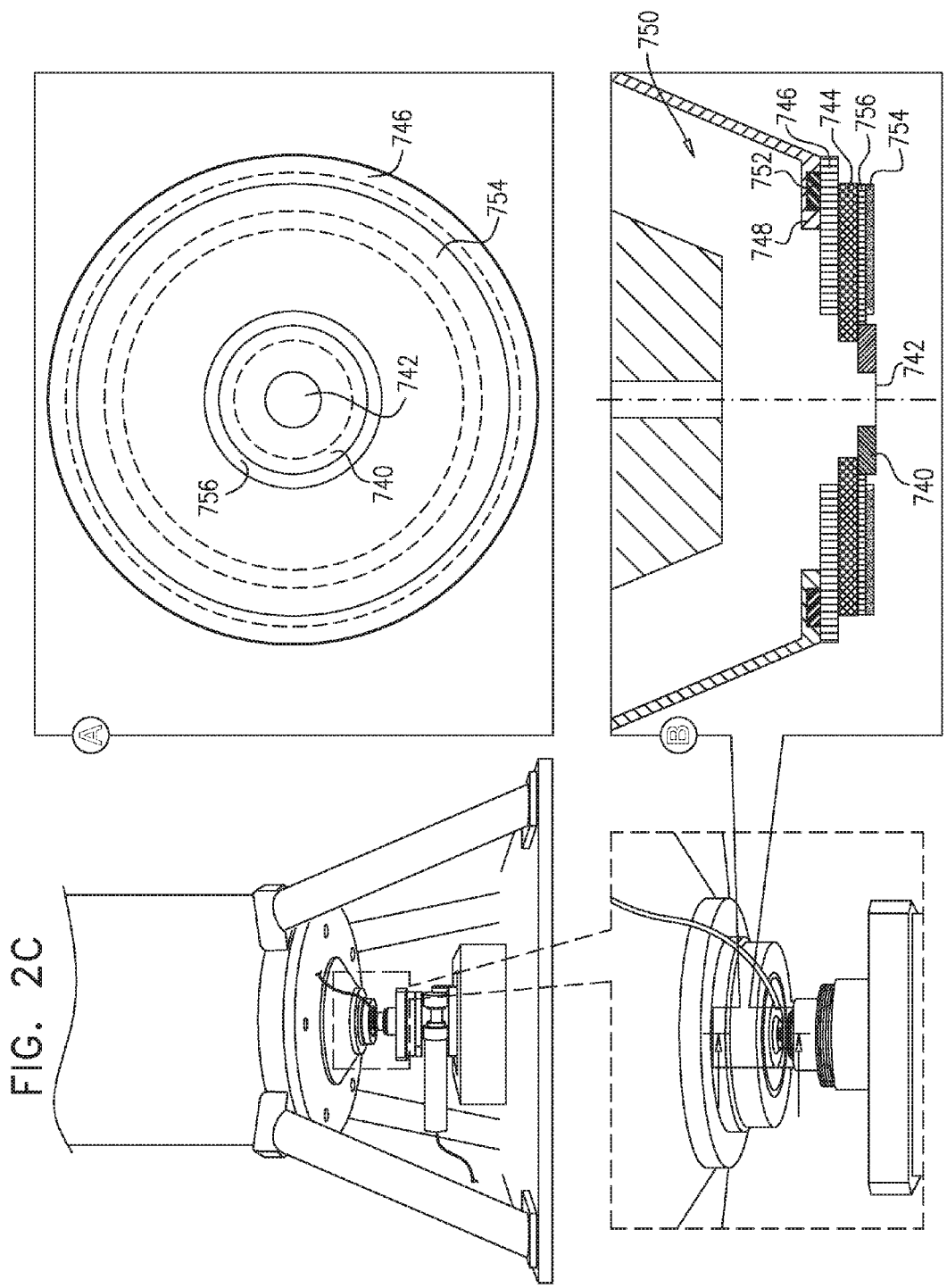

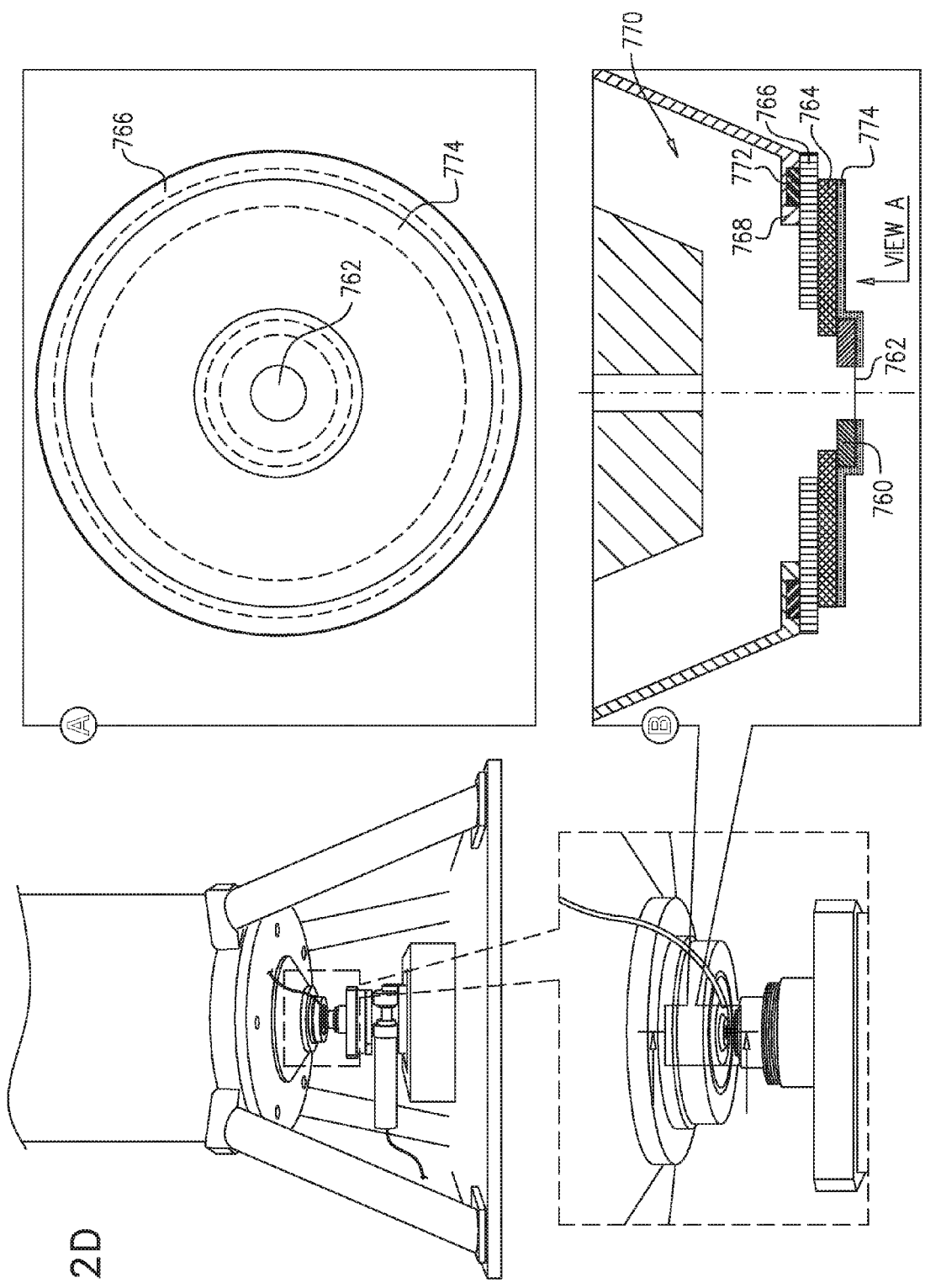

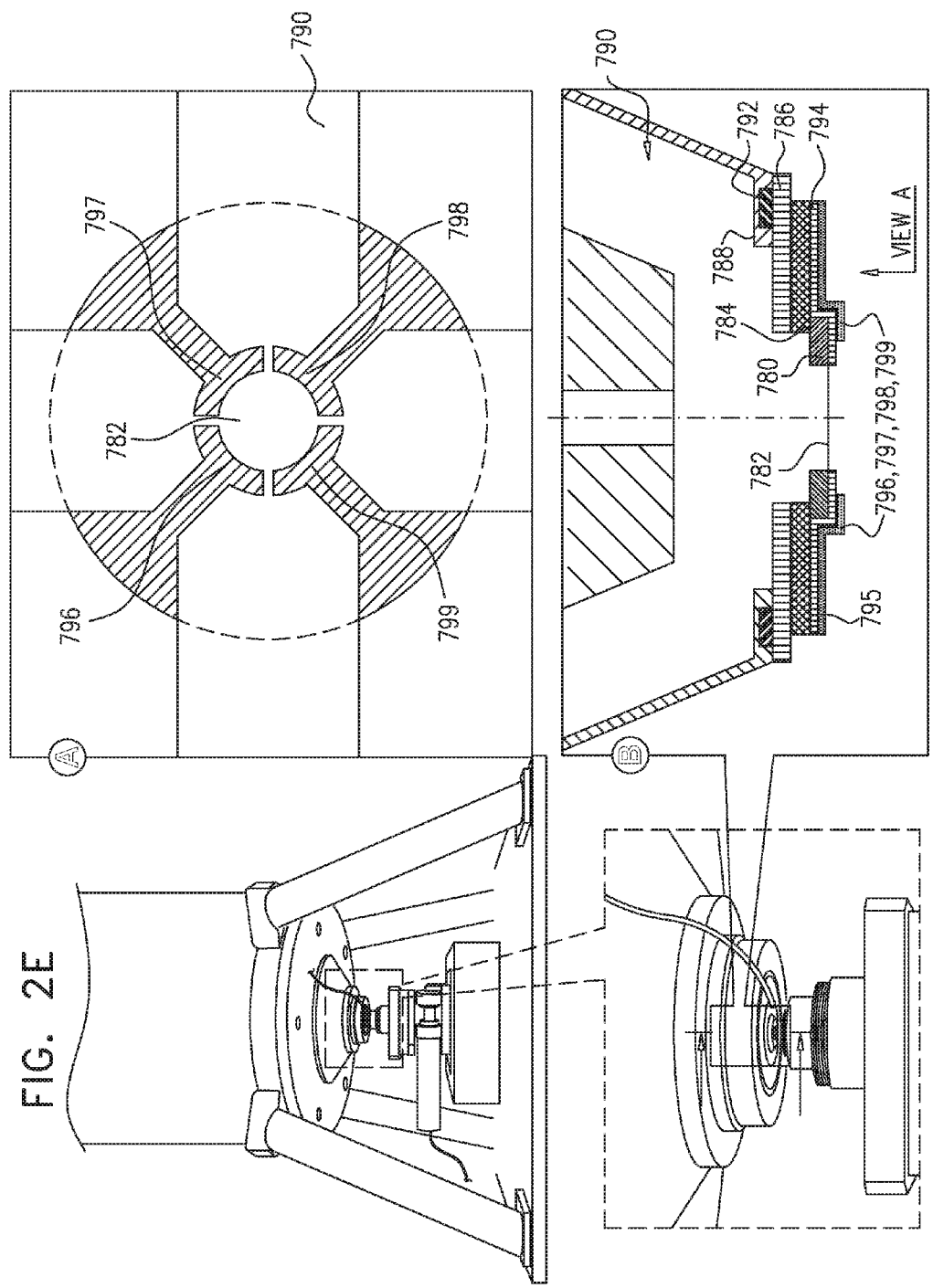

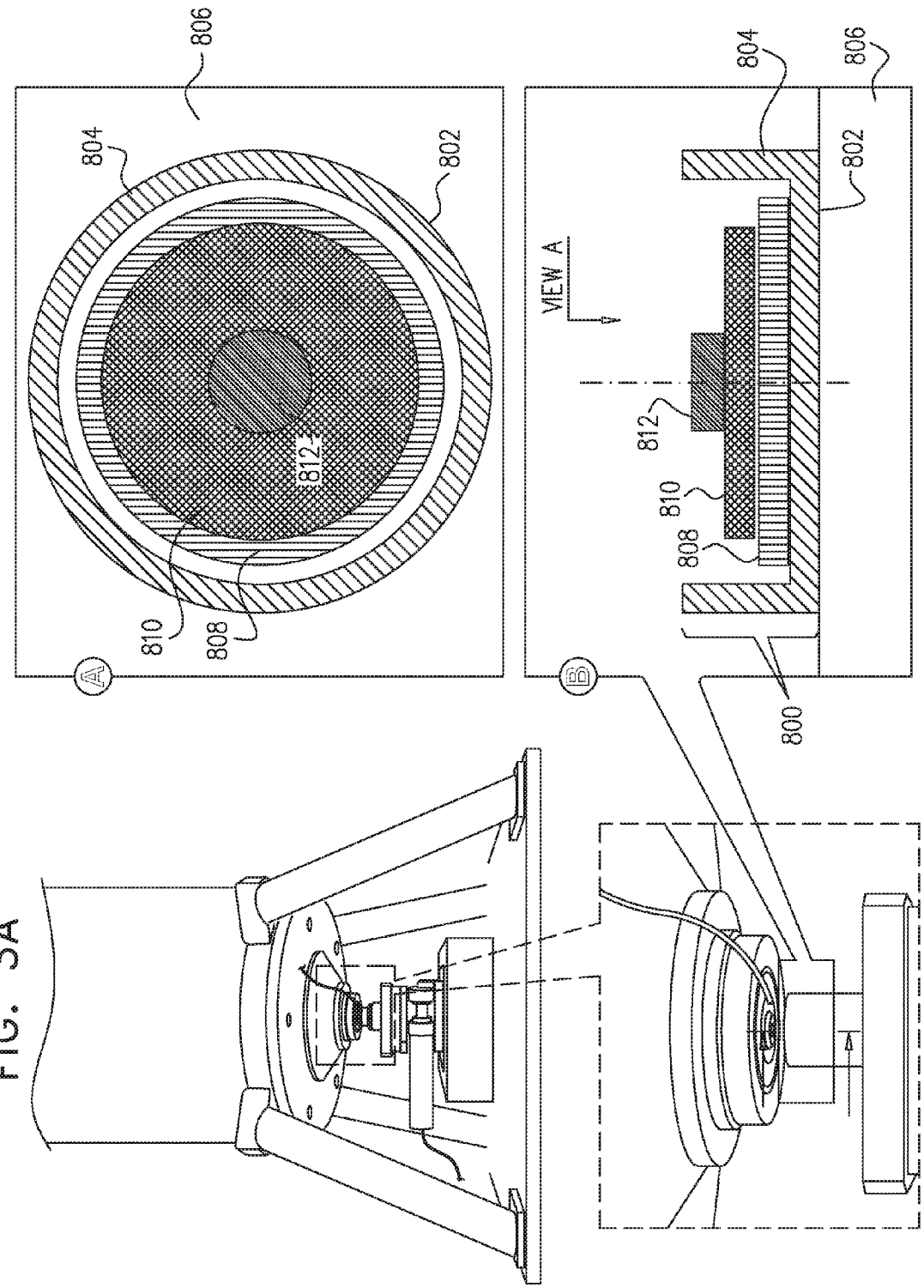

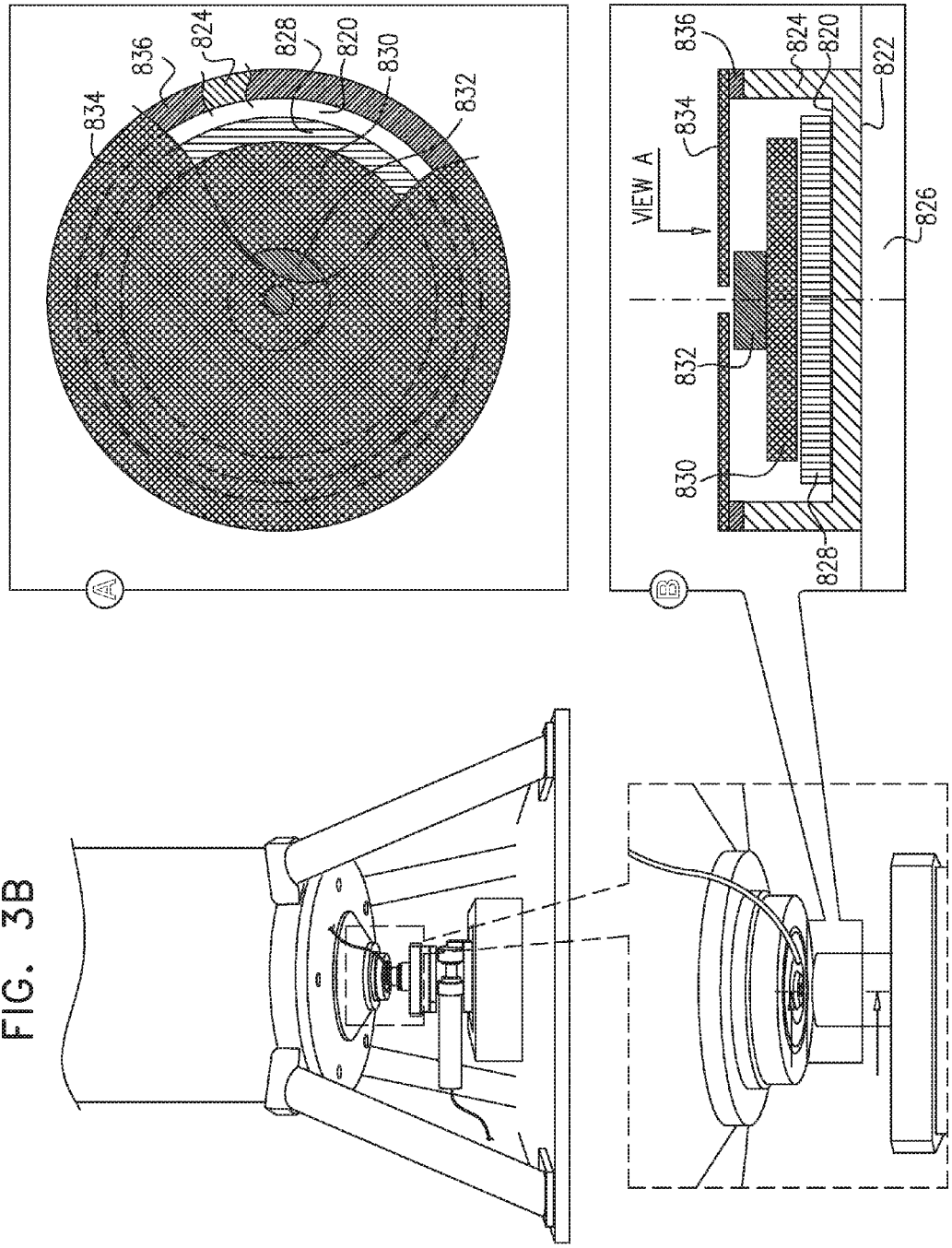

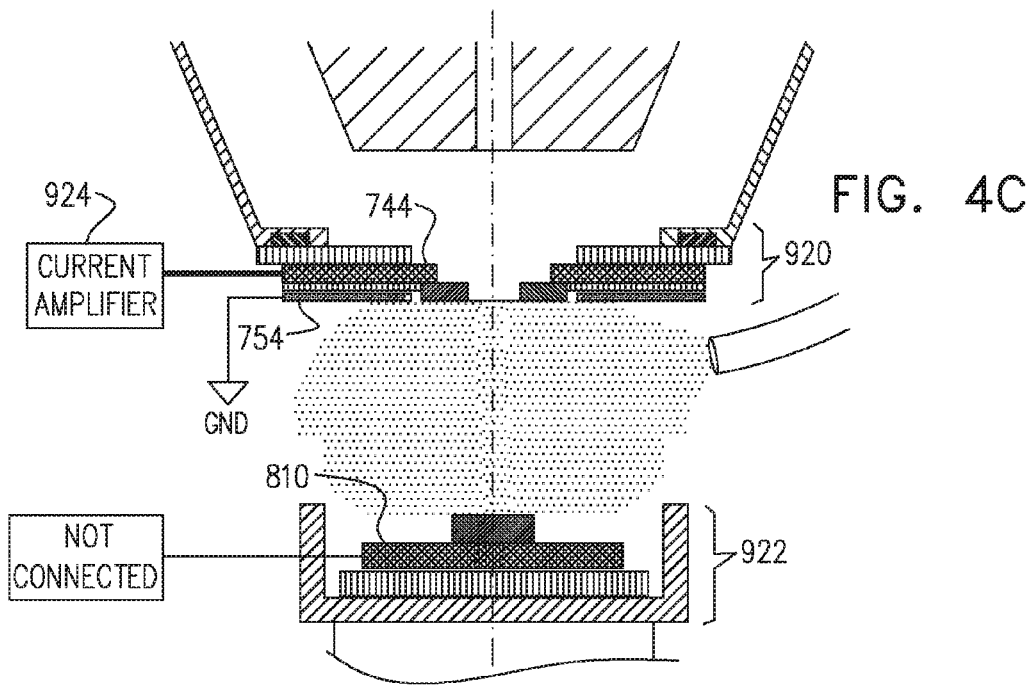
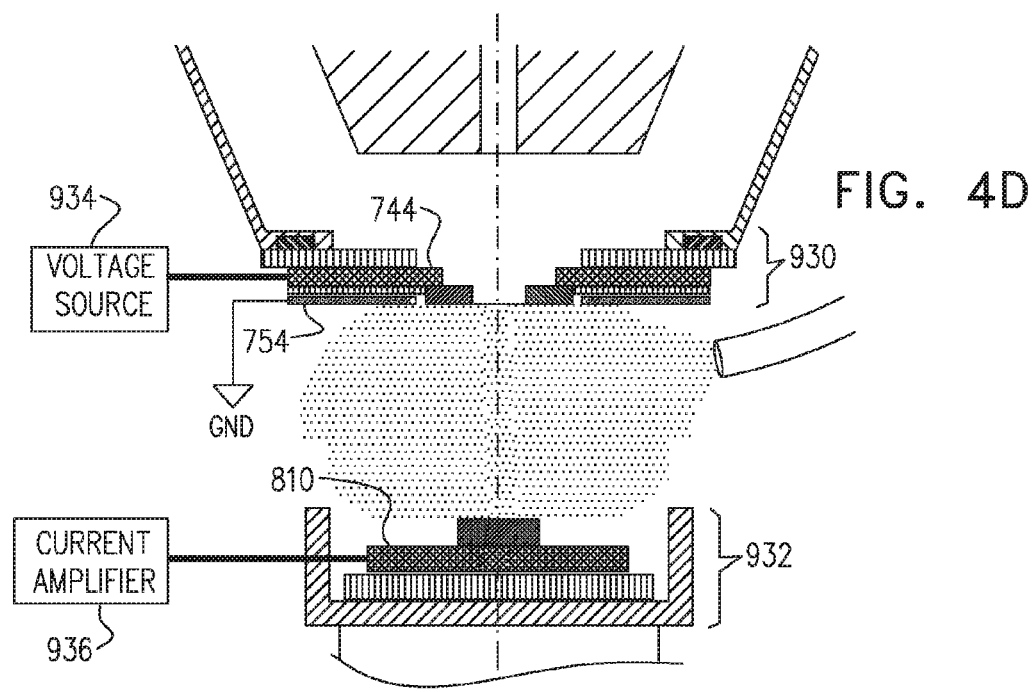

SCANNING ELECTRON MICROSCOPE

REFERENCE TO RELATED APPLICATIONS

Reference is hereby made to U.S. Provisional Patent Application Ser. 61/766,766, filed Feb. 20, 2013 and entitled "Scanning Electron Microscope," the disclosure of which is hereby incorporated by reference and priority of which is hereby claimed pursuant to 37 CFR 1.78(a)(4) and (5)(i).

Reference is also made to the following patent publications and pending patent applications, the contents of which are hereby incorporated by reference herein:

Published PCT Patent Application No. WO 2008/050321, entitled "An Interface, A Method For Observing An Object Within A Non-Vacuum Environment and A Scanning Electron Microscope" and filed Oct. 23, 2007;

Published PCT Patent Application No. WO 2010/001399, entitled "A Scanning Electron Microscope, An Interface and A Method For Observing An Object Within A Non-Vacuum Environment" and filed Jul. 2, 2009;

Published PCT Patent Application No. WO 2012/007941, entitled "A Vacuumed Device and A Scanning Electron Microscope" and filed Sep. 24, 2009;

Chinese Patent Application No. 201210299149.5, entitled "Electron Microscope Imaging System and Method" and filed Aug. 21, 2012; and U.S. Provisional Patent Application Ser. No. 61/655,567, entitled "Method For Improving Lateral Resolution" and filed Jun. 5, 2012.

FIELD OF THE INVENTION

The present invention relates generally to scanning electron microscopes.

BACKGROUND OF THE INVENTION

Various different types of scanning electron microscopes are known.

SUMMARY OF THE INVENTION

The present invention seeks to provide an improved scanning electron microscope.

There is thus provided in accordance with a preferred embodiment of the present invention a scanning electron microscope suitable for imaging samples in a non-vacuum environment, the scanning electron microscope including an electron source located within an enclosure maintained under vacuum, an electron permeable membrane disposed at an opening of the enclosure separating an environment within the enclosure which is maintained under vacuum and an environment outside the enclosure which is not maintained under vacuum, the electron permeable membrane not being electrically grounded and at least one non-grounded electrode operative as an electron detector.

There is also provided in accordance with another preferred embodiment of the present invention a scanning electron microscope suitable for imaging samples in a non-vacuum environment, the scanning electron microscope including an electron source located within an enclosure maintained under vacuum, an electron permeable membrane disposed at an opening of the enclosure separating an environment within the enclosure which is maintained under vacuum and an environment outside the enclosure which is not maintained under vacuum and at least one non-grounded electrode operative as a support for the electron permeable membrane and functioning as part of an electron detector.

There is further provided in accordance with yet another preferred embodiment of the present invention a scanning electron microscope suitable for imaging samples in a non-vacuum environment, the scanning electron microscope including an electron source located within an enclosure maintained under vacuum, an electron permeable membrane disposed at an opening of the enclosure separating an environment within the enclosure which is maintained under vacuum and an environment outside the enclosure which is not maintained under vacuum, a first non-grounded electrode operative as a support for the electron permeable membrane and functioning as part of an electron detector and a second non-grounded electrode operative associated with a sample support and functioning as part of an electron detector, a volume generally between the first and second electrodes generally being maintained at a positive pressure of less than 2 atmospheres.

There is even further provided in accordance with still another preferred embodiment of the present invention a scanning electron microscope suitable for imaging samples in a non-vacuum environment, the scanning electron microscope including an electron source located within an enclosure maintained under vacuum, an electron permeable membrane disposed at an opening of the enclosure separating an environment within the enclosure which is maintained under vacuum and an environment outside the enclosure which is not maintained under vacuum, an ionized gas generator operative to provide an ionized gas in the environment outside the enclosure and at least one non-grounded electrode operative as an electron detector.

Preferably, the scanning electron microscope suitable for imaging samples in a non-vacuum environment also includes an ionized gas generator operative to provide an ionized gas in the environment outside the enclosure.

In accordance with a preferred embodiment of the present invention the ionized gas forms a plasma.

In accordance with a preferred embodiment of the present invention the ionized gas generator includes at least one of an RF coil and an ionizing light source. Additionally or alternatively, the ionized gas generator includes a humidifier.

Preferably, the ionized gas includes humidified helium gas. Additionally, the humidified helium gas has a relative humidity of at least 30% at 20° C. More preferably, the humidified helium gas has a relative humidity of at least 50% at 20° C. Most preferably, the humidified helium gas has a relative humidity of at least 90% at 20° C.

Preferably, the at least one non-grounded electrode forms part of a support for the electron permeable membrane.

In accordance with a preferred embodiment of the present invention, the at least one non-grounded electrode is associated with a sample support.

In accordance with a preferred embodiment of the present invention the at least one non-grounded electrode is coupled to at least one of a current source and a voltage source.

Preferably, the electron detector includes at least one of a current amplifier and at least one Source Measuring Unit (SMU).

In accordance with a preferred embodiment of the present invention the scanning electron microscope suitable for imaging samples in a non-vacuum environment also includes at least one additional non-grounded electrode associated with a sample support and functioning as part of an electron detector. Additionally, at least one of the at least one non-grounded electrode and the at least one additional non-grounded electrode is coupled to at least one of a current source and a voltage source.

Preferably, at least one of the first non-grounded electrode and the second non-grounded electrode is coupled to at least one of a current source and a voltage source.

BRIEF DESCRIPTION OF THE DRAWINGS

The present invention will be understood and appreciated more fully from the following detailed description, taken in conjunction with the drawings in which:

FIGS. 1A, 1B, 1C, 1D, 1E and 1F are simplified illustrations of various embodiments of a scanning electron microscope, constructed and operative in accordance with a preferred embodiment of the present invention;

FIGS. 2A, 2B, 2C, 2D and 2E are simplified illustrations of five alternative electrode structures useful in the scanning electron microscopes of any of FIGS. 1A-1F;

FIGS. 3A and 3B are simplified illustrations of two alternative sample holder electrode structures useful in the scanning electron microscopes of any of FIGS. 1A-2E; and FIGS. 4A, 4B, 4C, 4D, 4E, 4F, 4G and 4H are simplified illustrations of various different electrical connections of various embodiments of scanning electron microscopes of the types shown above.

DETAILED DESCRIPTION OF A PREFERRED EMBODIMENT

Figure 1A:
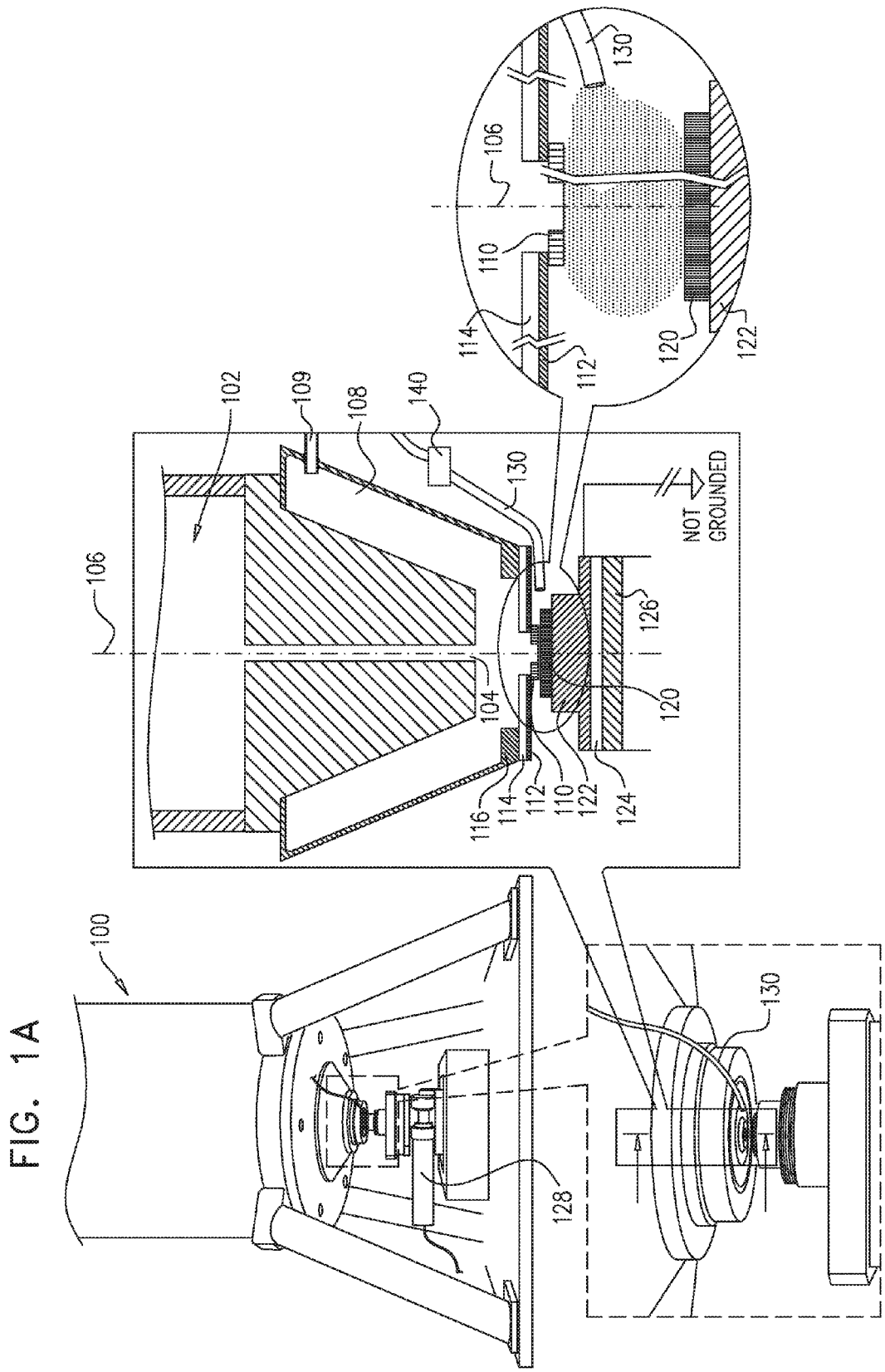

Reference is now made to FIG. 1A, which illustrates a scanning electron microscope 100 constructed and operative in accordance with a preferred embodiment of the present invention. In accordance with a preferred embodiment of the present invention, the scanning electron microscope 100 includes a conventional scanning electron microscope (SEM) column 102, an example of which is a SEM column which forms part of a Gemini® column based SEM, commercially available from Carl Zeiss SMT GmbH, Oberkochen, Germany, having a beam aperture 104 arranged along an optical axis 106 of the SEM column 102. The SEM column 102 is typically maintained under vacuum.

A vacuum interface 108, typically in the form of a vacuum enclosure coupled to a vacuum pump (not shown) via a conduit 109, interfaces between the interior of the SEM column 102 at the beam aperture 104 and the ambient and is formed with a vacuum retaining, beam permeable, membrane 110, which is aligned with the beam aperture 104 along optical axis 106.

Membrane 110 is preferably a model 4104SN-BA membrane, commercially available from SPI Supplies, West Chester, Pa., USA. In accordance with a preferred embodiment of the invention, the membrane 110 is not electrically grounded. It is noted that the thickness of the membrane 110 is in the nanometer range and is not shown to scale.

In accordance with a preferred embodiment of the present invention, the membrane 110 is supported onto the vacuum interface 108 by means of a membrane holder 112, typically in the form of an apertured disc formed of an electrical conductor, such as stainless steel. The membrane holder 112 sealingly underlies an electrical insulator 114, also typically in the form of an apertured disc. The electrical insulator 114 is sealingly mounted onto an inner facing bottom flange portion 116 of vacuum interface 108.

A sample, here designated by reference numeral 120, is located below and spaced from membrane 110, typically by a distance of up to 500 microns, and is positioned such that an electron beam directed along optical axis 106 impinges thereon. Sample 120 is preferably supported by a sample holder 122. Sample holder 122 is preferably formed of an electrical conductor, such as stainless steel or aluminum, and is not grounded. Sample holder 122 preferably is supported via an electrical insulator 124 onto a sample mount 126, which may form part of a sample manipulator 128.

Preferably, a gas, such as helium or nitrogen, is injected into the space between membrane 110 and sample 120, typically by means of one or more supply conduits 130.

It is a particular feature of an embodiment of the present invention that humidified helium gas is injected via one or more supply conduits 130. Preferably, the humidified helium gas is provided by passing at least 99% pure helium gas through a humidifier 140, such as a PDMSXA-2500 from MedArray, Inc., Ann Arbor, Mich., USA. Preferably, the relative humidity of the humidified helium gas is at least 30% at 20° C., more preferably, the relative humidity of the humidified helium gas is at least 50% at 20° C. and most preferably, the relative humidity of the humidified helium gas is at least 90% at 20° C.

In accordance with a preferred embodiment of the present invention, a volume formed between membrane holder 112, which is operative as a first electrode, and sample holder 122, which is operative as a second electrode, is maintained at a positive pressure of less than 2 atmospheres.

Figure 1B:
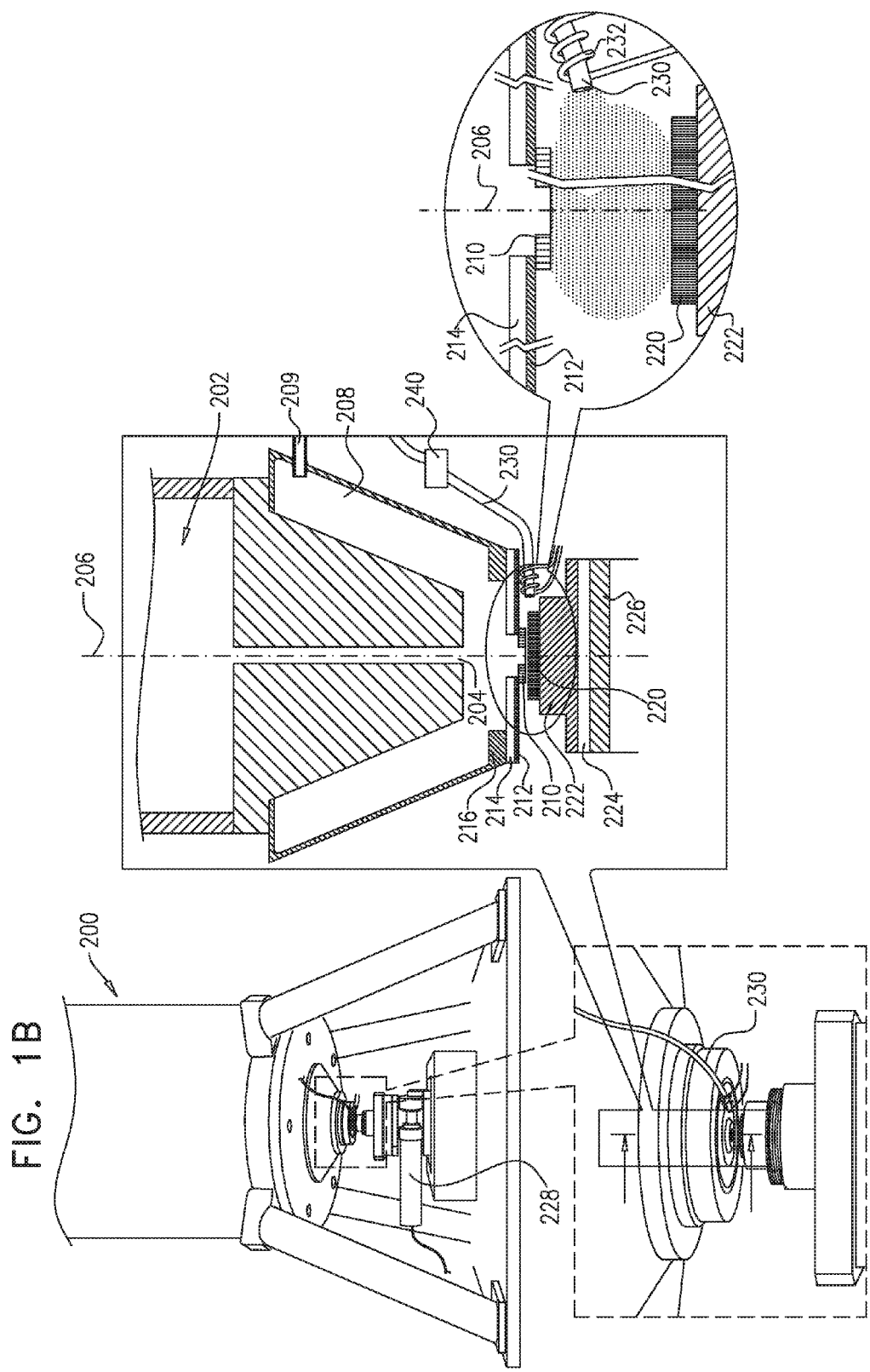

Reference is now made to FIG. 1B, which illustrates a scanning electron microscope 200 constructed and operative in accordance with another preferred embodiment of the present invention. In accordance with a preferred embodiment of the present invention, the scanning electron microscope 200 includes a conventional SEM column 202, an example of which is a SEM column which forms part of a Gemini® column based SEM, commercially available from Carl Zeiss SMT GmbH, Oberkochen, Germany, having a beam aperture 204 arranged along an optical axis 206 of the SEM column 202. The SEM column 202 is typically maintained under vacuum.

A vacuum interface 208, typically in the form of a vacuum enclosure coupled to a vacuum pump (not shown) via a conduit 209, interfaces between the interior of the SEM column 202 at the beam aperture 204 and the ambient and is formed with a vacuum retaining, beam permeable, membrane 210, which is aligned with the beam aperture 204 along optical axis 206.

Membrane 210 is preferably a model 4104SN-BA membrane, commercially available from SPI Supplies, West Chester, Pa., USA. In accordance with a preferred embodiment of the invention, the membrane 210 is not electrically grounded. It is noted that the thickness of the membrane 210 is in the nanometer range and is not shown to scale.

In accordance with a preferred embodiment of the present invention, the membrane 210 is supported onto the vacuum interface 208 by means of a membrane holder 212, typically in the form of an apertured disc formed of an electrical conductor, such as stainless steel. The membrane holder 212 sealingly underlies an electrical insulator 214, also typically in the form of an apertured disc. The electrical insulator 214 is sealingly mounted onto an inner facing bottom flange portion 216 of vacuum interface 208.

A sample, here designated by reference numeral 220, is located below and spaced from membrane 210, typically by a distance of up to 500 microns, and is positioned such that an electron beam directed along optical axis 206 impinges thereon. Sample 220 is preferably supported by a sample holder 222. Sample holder 222 is preferably formed of an electrical conductor, such as stainless steel or aluminum, and may or may not be grounded, depending on the application. Sample holder 222 may be supported via an electrical insulator 224 onto a sample mount 226, which may form part of a sample manipulator 228.

Preferably, a gas, such as helium or nitrogen, is injected into the space between membrane 210 and sample 220, typically by means of one or more supply conduits 230. In accordance with a preferred embodiment of the present invention, an RF coil 232 is provided preferably surrounding conduit 230 to ionize the gas passing therethrough and thus produce a plasma in the space between membrane 210 and sample 220.

It is a particular feature of an embodiment of the present invention that humidified helium gas is injected via one or more supply conduits 230. Preferably, the humidified helium gas is provided by passing at least 99% pure helium gas through a humidifier 240, such as a PDMSXA-2500 from MedArray, Inc., Ann Arbor, Mich., USA. Preferably, the relative humidity of the humidified helium gas is at least 30% at 20° C., more preferably, the relative humidity of the humidified helium gas is at least 50% at 20° C. and most preferably, the relative humidity of the humidified helium gas is at least 90% at 20° C.

In accordance with a preferred embodiment of the present invention, a volume formed between membrane holder 212, which is operative as a first electrode, and sample holder 222, which is operative as a second electrode, is maintained at a positive pressure of less than 2 atmospheres.

Reference is now made to FIG. 1C, which illustrates a scanning electron microscope 300 constructed and operative in accordance with another preferred embodiment of the present invention. In accordance with a preferred embodiment of the present invention, the scanning electron microscope 300 includes a conventional SEM column 302, an example of which is a SEM column which forms part of a Gemini® column based SEM, commercially available from Carl Zeiss SMT GmbH, Oberkochen, Germany, having a beam aperture 304 arranged along an optical axis 306 of the SEM column 302. The SEM column 302 is typically maintained under vacuum.

A vacuum interface 308, typically in the form of a vacuum enclosure coupled to a vacuum pump (not shown) via a conduit 309, interfaces between the interior of the SEM column 302 at the beam aperture 304 and the ambient and is formed with a vacuum retaining, beam permeable, membrane 310, which is aligned with the beam aperture 304 along optical axis 306.

Membrane 310 is preferably a model 4104SN-BA membrane, commercially available from SPI Supplies, West Chester, Pa., USA. In accordance with a preferred embodiment of the invention, the membrane 310 is not electrically grounded. It is noted that the thickness of the membrane 310 is in the nanometer range and is not shown to scale.

In accordance with a preferred embodiment of the present invention, the membrane 310 is supported onto the vacuum interface 308 by means of a membrane holder 312, typically in the form of an apertured disc formed of an electrical conductor, such as stainless steel. The membrane holder 312 sealingly underlies an electrical insulator 314, also typically in the form of an apertured disc. The electrical insulator 314 is sealingly mounted onto an inner facing bottom flange portion 316 of vacuum interface 308.

A sample, here designated by reference numeral 320, is located below and spaced from membrane 310, typically by a distance of up to 500 microns and is positioned such that an electron beam directed along optical axis 306 impinges thereon. Sample 320 is preferably supported by a sample holder 322. Sample holder 322 is preferably formed of an electrical conductor, such as stainless steel or aluminum, and may or may not be grounded, depending on the application. Sample holder 322 may be supported via an electrical insulator 324 onto a sample mount 326, which may form part of a sample manipulator 328.

Preferably, a gas, such as helium or nitrogen, is injected into the space between membrane 310 and sample 320 typically by means of one or more supply conduits 330. In accordance with a preferred embodiment of the present invention, an RF coil 332 is provided alongside the space between membrane 310 and sample 320 to ionize the gas located therein and thus produce a plasma in the space between membrane 310 and sample 320.

It is a particular feature of an embodiment of the present invention that humidified helium gas is injected via one or more supply conduits 330. Preferably, the humidified helium gas is provided by passing at least 99% pure helium gas through a humidifier 340, such as a PDMSXA-2500 from MedArray, Inc., Ann Arbor, Mich., USA. Preferably, the relative humidity of the humidified helium gas is at least 30% at 20° C., more preferably, the relative humidity of the humidified helium gas is at least 50% at 20° C. and most preferably, the relative humidity of the humidified helium gas is at least 90% at 20° C.

In accordance with a preferred embodiment of the present invention, a volume formed between membrane holder 312, which is operative as a first electrode, and sample holder 322, which is operative as a second electrode, is maintained at a positive pressure of less than 2 atmospheres.

Reference is now made to FIG. 1D, which illustrates a scanning electron microscope 400 constructed and operative in accordance with another preferred embodiment of the present invention. In accordance with a preferred embodiment of the present invention, the scanning electron microscope 400 includes a conventional SEM column 402, an example of which is a SEM column which forms part of a Gemini® column based SEM, commercially available from Carl Zeiss SMT GmbH, Oberkochen, Germany, having a beam aperture 404 arranged along an optical axis 406 of the SEM column 402. The SEM column 402 is typically maintained under vacuum.

A vacuum interface 408, typically in the form of a vacuum enclosure coupled to a vacuum pump (not shown) via a conduit 409, interfaces between the interior of the SEM column 402 at the beam aperture 404 and the ambient and is formed with a vacuum retaining, beam permeable, membrane 410, which is aligned with the beam aperture 404 along optical axis 406.

Membrane 410 is preferably a model 4104SN-BA membrane, commercially available from SPI Supplies, West Chester, Pa., USA. In accordance with a preferred embodiment of the invention, the membrane 410 is not electrically grounded. It is noted that the thickness of the membrane 410 is in the nanometer range and is not shown to scale.

In accordance with a preferred embodiment of the present invention, the membrane 410 is supported onto the vacuum interface 408 by means of a membrane holder 412, typically in the form of an apertured disc formed of an electrical conductor, such as stainless steel. The membrane holder 412 sealingly underlies an electrical insulator 414, also typically in the form of an apertured disc. The electrical insulator 414 is sealingly mounted onto an inner facing bottom flange portion 416 of vacuum interface 408.

A sample, here designated by reference numeral 420, is located below and spaced from membrane 410, typically by a distance of up to 500 microns, and is positioned such that an electron beam directed along optical axis 406 impinges thereon. Sample 420 is preferably supported by a sample holder 422. Sample holder 422 is preferably formed of an electrical conductor, such as stainless steel or aluminum, and may or may not be grounded, depending on the application. Sample holder 422 may be supported via an electrical insulator 424 onto a sample mount 426, which may form part of a sample manipulator 428.

Preferably, a gas, such as helium or nitrogen, is injected into the space between membrane 410 and sample 420, typically by means of one or more supply conduits 430. In accordance with a preferred embodiment of the present invention, an ionizing light source 434, such as a laser or a mercury lamp, is provided alongside the space between membrane 410 and sample 420 to ionize the gas located therein and thus produce a plasma in the space between membrane 410 and sample 420.

It is a particular feature of an embodiment of the present invention that humidified helium gas is injected via one or more supply conduits 430. Preferably, the humidified helium gas is provided by passing at least 99% pure helium gas through a humidifier 440, such as a PDMSXA-2500 from MedArray, Inc., Ann Arbor, Mich., USA. Preferably, the relative humidity of the humidified helium gas is at least 30% at 20° C., more preferably, the relative humidity of the humidified helium gas is at least 50% at 20° C. and most preferably, the relative humidity of the humidified helium gas is at least 90% at 20° C.

In accordance with a preferred embodiment of the present invention, a volume formed between membrane holder 412, which is operative as a first electrode, and sample holder 422, which is operative as a second electrode, is maintained at a positive pressure of less than 2 atmospheres.

Figure 1E:
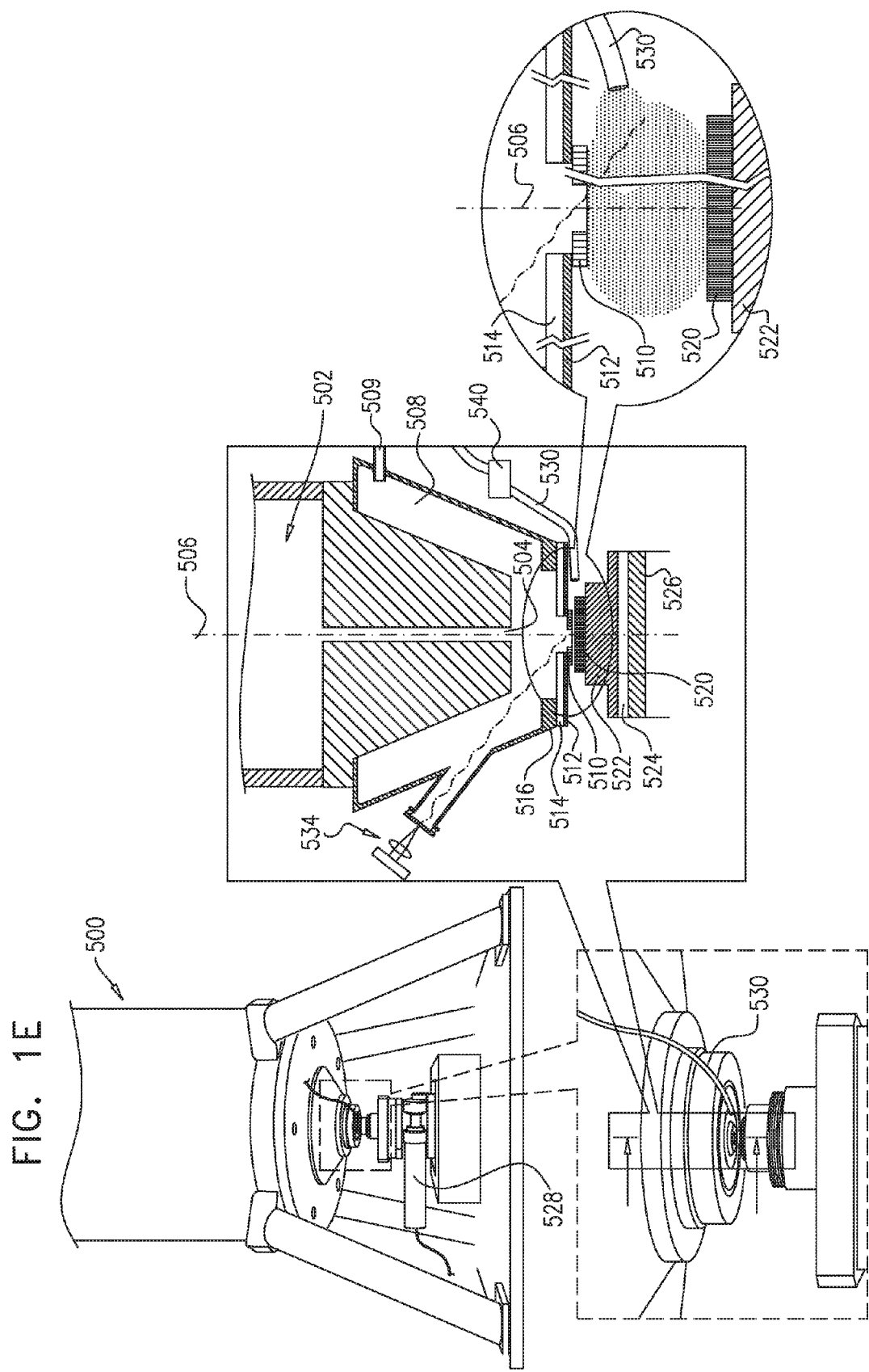

Reference is now made to FIG. 1E, which illustrates a scanning electron microscope 500 constructed and operative in accordance with another preferred embodiment of the present invention. In accordance with a preferred embodiment of the present invention, the scanning electron microscope 500 includes a conventional SEM column 502, an example of which is a SEM column which forms part of a Gemini® column based SEM, commercially available from Carl Zeiss SMT GmbH, Oberkochen, Germany, having a beam aperture 504 arranged along an optical axis 506 of the SEM column 502. The SEM column 502 is typically maintained under vacuum.

A vacuum interface 508, typically in the form of a vacuum enclosure coupled to a vacuum pump (not shown) via a conduit 509, interfaces between the interior of the SEM column 502 at the beam aperture 504 and the ambient and is formed with a vacuum retaining, beam permeable membrane 510, which is aligned with the beam aperture 504 along optical axis 506.

Membrane 510 is preferably a model 4104SN-BA membrane, commercially available from SPI Supplies, West Chester, Pa., USA. In accordance with a preferred embodiment of the invention, the membrane 510 is not electrically grounded. It is noted that the thickness of the membrane 510 is in the nanometer range and is not shown to scale.

In accordance with a preferred embodiment of the present invention, the membrane 510 is supported onto the vacuum interface 508 by means of a membrane holder 512, typically in the form of an apertured disc formed of an electrical conductor, such as stainless steel. The membrane holder 512 sealingly underlies an electrical insulator 514, also typically in the form of an apertured disc. The electrical insulator 514 is sealingly mounted onto an inner facing bottom flange portion 516 of vacuum interface 508.

A sample, here designated by reference numeral 520, is located below and spaced from membrane 510, typically by a distance of up to 500 microns and is positioned such that an electron beam directed along optical axis 506 impinges thereon. Sample 520 is preferably supported by a sample holder 522. Sample holder 522 is preferably formed of an electrical conductor, such as stainless steel or aluminum, and may or may not be grounded, depending on the application. Sample holder 522 may be supported via an electrical insulator 524 onto a sample mount 526, which may form part of a sample manipulator 528.

Preferably, a gas, such as helium or nitrogen, is injected into the space between membrane 510 and sample 520, typically by means of one or more supply conduits 530. In accordance with a preferred embodiment of the present invention, an ionizing light source 534, such as a laser or a mercury lamp, directs an ionizing light beam through vacuum interface 508 and membrane 510 to ionize the gas located in the space between membrane 510 and sample 520 and thus to produce a plasma in the space between membrane 510 and sample 520.

It is a particular feature of an embodiment of the present invention that humidified helium gas is injected via one or more supply conduits 530. Preferably, the humidified helium gas is provided by passing at least 99% pure helium gas through a humidifier 540, such as a PDMSXA-2500 from MedArray, Inc., Ann Arbor, Mich., USA. Preferably, the relative humidity of the humidified helium gas is at least 30% at 20° C., more preferably, the relative humidity of the humidified helium gas is at least 50% at 20° C. and most preferably, the relative humidity of the humidified helium gas is at least 90% at 20° C.

In accordance with a preferred embodiment of the present invention, a volume formed between membrane holder 512, which is operative as a first electrode, and sample holder 522, which is operative as a second electrode, is maintained at a positive pressure of less than 2 atmospheres.

Reference is now made to FIG. 1F, which illustrates a scanning electron microscope 600 constructed and operative in accordance with another preferred embodiment of the present invention. In accordance with a preferred embodiment of the present invention, the scanning electron microscope 600 includes a conventional SEM column 602, an example of which is a SEM column which forms part of a Gemini® column based SEM, commercially available from Carl Zeiss SMT GmbH, Oberkochen, Germany, having a beam aperture 604 arranged along an optical axis 606 of the SEM column 602. The SEM column 602 is typically maintained under vacuum.

A vacuum interface 608, typically in the form of a vacuum enclosure coupled to a vacuum pump (not shown) via a conduit 609, interfaces between the interior of the SEM column 602 at the beam aperture 604 and the ambient and is formed with a vacuum retaining, beam permeable membrane 610, which is aligned with the beam aperture 604 along optical axis 606.

Membrane 610 is preferably a model 4104SN-BA membrane, commercially available from SPI Supplies, West Chester, Pa., USA. In accordance with a preferred embodiment of the invention, the membrane 610 is not electrically grounded. It is noted that the thickness of the membrane 610 is in the nanometer range and is not shown to scale.

In accordance with a preferred embodiment of the present invention, the membrane 610 is supported onto the vacuum interface 608 by means of a membrane holder 612, typically in the form of an apertured disc formed of an electrical conductor, such as stainless steel. The membrane holder 612 sealingly underlies an electrical insulator 614, also typically in the form of an apertured disc. The electrical insulator 614 is sealingly mounted onto an inner facing bottom flange portion 616 of vacuum interface 608.

A sample, here designated by reference numeral 620, is located below and spaced from membrane 610, typically by a distance of up to 500 microns, and is positioned such that an electron beam directed along optical axis 606 impinges thereon. Sample 620 is preferably supported by a sample holder 622. Sample holder 622 is preferably formed of an electrical conductor, such as stainless steel or aluminum, and may or may not be grounded, depending on the application. Sample holder 622 may be supported via an electrical insulator 624 onto a sample mount 626, which may form part of a sample manipulator 628.

Preferably, a gas, such as helium or nitrogen, is injected into the space between membrane 610 and sample 620 typically by means of one or more supply conduits 630. In accordance with a preferred embodiment of the present invention, an electron beam source 634 directs an electron beam, preferably having an energy of 1-10 KeV, through vacuum interface 608 and membrane 610 to ionize the gas located in the space between membrane 610 and sample 620 and thus to produce a plasma in the space between membrane 610 and sample 620.

It is a particular feature of an embodiment of the present invention that humidified helium gas is injected via one or more supply conduits 630. Preferably, the humidified helium gas is provided by passing at least 99% pure helium gas through a humidifier 640, such as a PDMSXA-2500 from MedArray, Inc., Ann Arbor, Mich., USA. Preferably, the relative humidity of the humidified helium gas is at least 30% at 20° C., more preferably, the relative humidity of the humidified helium gas is at least 50% at 20° C. and most preferably, the relative humidity of the humidified helium gas is at least 90% at 20° C.

In accordance with a preferred embodiment of the present invention, a volume formed between membrane holder 612, which is operative as a first electrode, and sample holder 622, which is operative as a second electrode, is maintained at a positive pressure of less than 2 atmospheres.

Reference is now made to FIGS. 2A-2E, which are simplified illustrations of five alternative electrode structures useful in the scanning electron microscopes of any of FIGS. 1A-1F.

Turning to FIG. 2A, it is seen that the vacuum retaining, beam permeable membrane comprises an electrically conductive peripheral membrane support frame 700, typically formed of silicon or stainless steel, onto which is attached a relatively thin membrane portion 702, preferably formed of silicon nitride, silicon, carbon, or a polymer, preferably of thickness less than 100 nm and more preferably between 2-50 nm. One example of such a membrane support frame 700 and a thin membrane portion 702 is a model 4104SN-BA 30 nm silicon nitride membrane, commercially available from SPI Supplies, West Chester, Pa., USA.

Membrane support frame 700 is sealingly adhered to an electrically conductive membrane support 704, which in turn sealingly mounted under an electrically insulative disc 706. Insulative disc 706 is sealingly adhered to the underside of a flange portion 708 of a vacuum interface 710, which is preferably formed with a sealing ring 712 to enhance sealing between flange portion 708 and insulative disc 706.

Turning now to FIG. 2B, it is seen that here a vacuum retaining, beam permeable membrane comprises an electrically conductive peripheral membrane support frame 720, typically formed of silicon or stainless steel, onto which is attached a relatively thin membrane portion 722, preferably formed of silicon nitride, silicon, carbon, or a polymer, preferably of thickness less than 100 nm and more preferably between 2-50 nm. One example of such a membrane support frame 720 and a thin membrane portion 722 is a model 4104SN-BA 30 nm silicon nitride membrane, commercially available from SPI Supplies, West Chester, Pa., USA.

Membrane support frame 720 is sealingly mounted under an electrically insulative disc 726. Insulative disc 726 is sealingly adhered to the underside of a flange portion 728 of a vacuum interface 730, which is preferably formed with a sealing ring 732 to enhance sealing between flange portion 728 and insulative disc 726.

Turning now to FIG. 2C, it is seen that here, a vacuum retaining, beam permeable membrane comprises a peripheral membrane support frame 740, typically formed of silicon or stainless steel, onto which is attached a relatively thin membrane portion 742, preferably formed of silicon nitride, silicon, carbon, or a polymer, preferably of thickness less than 100 nm and more preferably between 2-50 nm. One example of such a membrane support frame 740 and a thin membrane portion 742 is a model 4104SN-BA 30 nm silicon nitride membrane, commercially available from SPI Supplies, West Chester, Pa., USA.

Membrane support frame 740 is sealingly adhered to an electrically conductive membrane support 744, which in turn sealingly mounted under an electrically insulative disc 746. Insulative disc 746 is sealingly adhered to the underside of a flange portion 748 of a vacuum interface 750, which is preferably formed with a sealing ring 752 to enhance sealing between flange portion 748 and insulative disc 746.

As distinguished from the embodiment of FIG. 2A, there is additionally provided a conductive disc 754 adhered to and underlying an insulative disc 756, which in turn is adhered to and underlies conductive membrane support 744.

Turning now to FIG. 2D, it is seen that here, a vacuum retaining, beam permeable membrane comprises a peripheral membrane support frame 760, typically formed of silicon or stainless steel, onto which is attached a relatively thin membrane portion 762, preferably formed of silicon nitride, silicon, carbon, or a polymer, preferably of thickness less than 100 nm and more preferably between 2-50 nm. One example of such a membrane support frame 760 and a thin membrane portion 762 is a model 4104SN-BA 30 nm silicon nitride membrane, commercially available from SPI Supplies, West Chester, Pa., USA.

Membrane support frame 760 is sealingly adhered to a membrane support 764, which in turn sealingly mounted under an electrically insulative disc 766. Insulative disc 766 is sealingly adhered to the underside of a flange portion 768 of a vacuum interface 770, which is preferably formed with a sealing ring 772 to enhance sealing between flange portion 768 and insulative disc 766.

As distinguished from the embodiment of FIG. 2A, here the membrane support frame 760 and the membrane support 764 may or may not be conductive and there is additionally provided a conductive layer 774 adhered to and underlying an membrane support frame 760 and membrane support 764.

Turning now to FIG. 2E, it is seen that here, a vacuum retaining, beam permeable membrane comprises a peripheral membrane support frame 780, typically formed of silicon or stainless steel, onto which is attached a relatively thin membrane portion 782, preferably formed of silicon nitride, silicon, carbon, or a polymer, preferably of thickness less than 100 nm and more preferably between 2-50 nm. One example of such a membrane support frame 780 and a thin membrane portion 782 is a model 4104SN-BA 30 nm silicon nitride membrane, commercially available from SPI Supplies, West Chester, Pa., USA.

Membrane support frame 780 is sealingly adhered to a membrane support 784, which in turn sealingly mounted under an electrically insulative disc 786. Insulative disc 786 is sealingly adhered to the underside of a flange portion 788 of a vacuum interface 790, which is preferably formed with a sealing ring 792 to enhance sealing between flange portion 788 and insulative disc 786.

As distinguished from the embodiment of FIG. 2D, here the membrane support frame 780 and the membrane support 784 are conductive and an insulative layer 794 is interposed between a conductive layer 795 and membrane support frame 780 and membrane support 784. In this configuration, the conductive layer 795 need not be continuous and may be arranged, for example, in mutually electrically insulated quadrants 796, 797, 798 and 799 as shown. The insulative layer 794 is here seen to have a generally disc-like configuration.

Reference is now made to FIGS. 3A and 3B, which are simplified illustrations of two alternative sample holder electrode structures useful in the scanning electron microscopes of any of FIGS. 1A-2E.

Turning to FIG. 3A, it is seen that the sample holder comprises a sample holder base element 800, typically including a circular base portion 802 and a circumferential cylindrical side wall 804, integrally formed therewith. Base element 800 is preferably formed of an electrical conductor, such as aluminum or stainless steel, and is preferably mounted on a sample manipulator 806.

Disposed on circular base 802 there is preferably provided an electrically insulative disc 808 onto which there is preferably disposed a disc 810, which is formed of an electrically conductive material, typically aluminum or stainless steel. A sample 812 may be placed onto disc 810 so as to be impinged upon by at least one electron beam.

Turning to FIG. 3B, it is seen that here the sample holder comprises, similarly to the embodiment of FIG. 3A, a sample holder base element 820, typically including a circular base portion 822 and a circumferential cylindrical side wall 824, integrally formed therewith. Base element 820 is preferably formed of an electrical conductor, such as aluminum or stainless steel, and is preferably mounted on a sample manipulator 826.

Disposed on circular base 822 there is preferably provided an electrically insulative disc 828 onto which there is preferably disposed a disc 830, which is formed of an electrically conductive material, typically aluminum or stainless steel. A sample 832 may be placed onto disc 830 so as to be impinged upon by at least one electron beam.

As distinguished from the embodiment of FIG. 3A, in the embodiment of FIG. 3B there is provided an additional electrically conductive apertured disc 834 which is mounted on base element 820 and electrically insulated therefrom by means of an electrically insulative ring 836.

Reference is now made to FIGS. 4A, 4B, 4C, 4D, 4E, 4F, 4G and 4H, which are simplified illustrations of various different electrical connections of various embodiments of scanning electron microscopes of the types shown hereinabove.

Figure 4A:
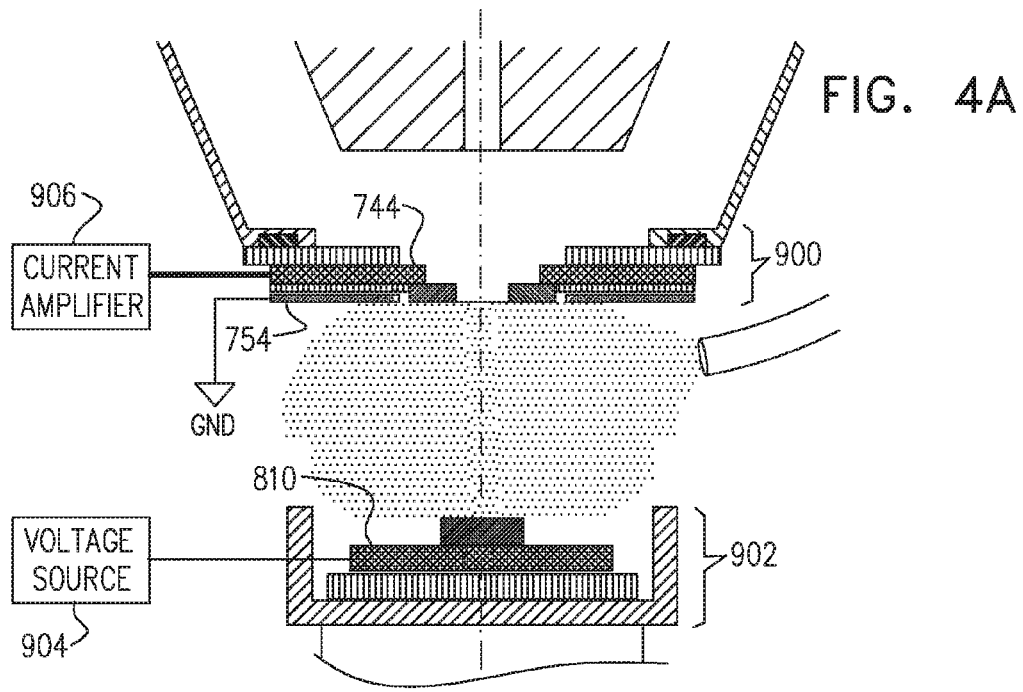

Turning to FIG. 4A, it is seen that the structure of the membrane holder 900 is similar to that shown in FIG. 2C and the structure of the sample holder 902 is similar to that shown in FIG. 3A. It is seen that the conductive disc 810 (FIG. 3A) operates as an electrode and is coupled to a voltage source 904. It is also seen that apertured disc 754 (FIG. 2C) operates as an additional electrode as is coupled to ground and that apertured disc 744 operates as an output electrode and is coupled via a current amplifier 906 to detection circuitry (not shown).

Figure 4B:
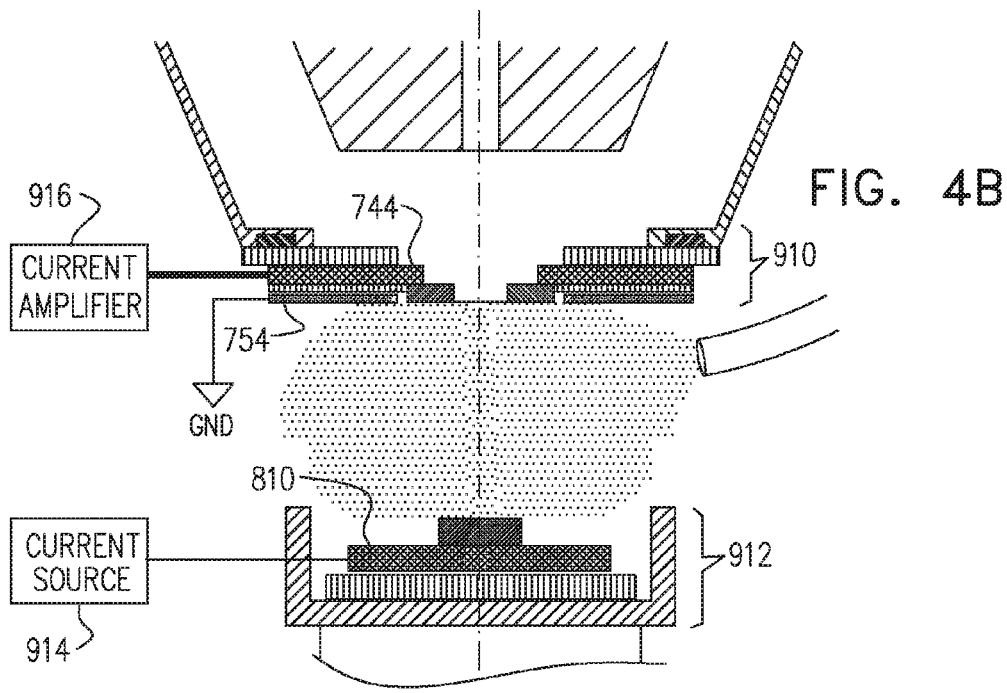

Turning to FIG. 4B, it is seen that the structure of the membrane holder 910 is similar to that shown in FIG. 2C and the structure of the sample holder 912 is similar to that shown in FIG. 3A. It is seen that the conductive disc 810 (FIG. 3A) operates as an electrode and is coupled to a current source 914. It is also seen that apertured disc 754 (FIG. 2C) operates as an additional electrode as is coupled to ground and that apertured disc 744 operates as an output electrode and is coupled via a current amplifier 916 to detection circuitry (not shown).

Turning to FIG. 4C, it is seen that the structure of the membrane holder 920 is similar to that shown in FIG. 2C and the structure of the sample holder 922 is similar to that shown in FIG. 3A. It is seen that the conductive disc 810 (FIG. 3A) is floating and is coupled neither to ground nor to a voltage or current source. It is also seen that apertured disc 754 (FIG. 2C) operates as an electrode as is coupled to ground and that apertured disc 744 operates as an output electrode and is coupled via a current amplifier 924 to detection circuitry (not shown).

Turning to FIG. 4D, it is seen that the structure of the membrane holder 930 is similar to that shown in FIG. 2C and the structure of the sample holder 932 is similar to that shown in FIG. 3A. It is seen that the apertured disc 744 (FIG. 2C) operates as an electrode and is coupled to a voltage source 934. It is also seen that apertured disc 754 (FIG. 2C) operates as an additional electrode as is coupled to ground and that conductive disc 810 (FIG. 3A) operates as an output electrode and is coupled via a current amplifier 936 to detection circuitry (not shown).

Figure 4E:
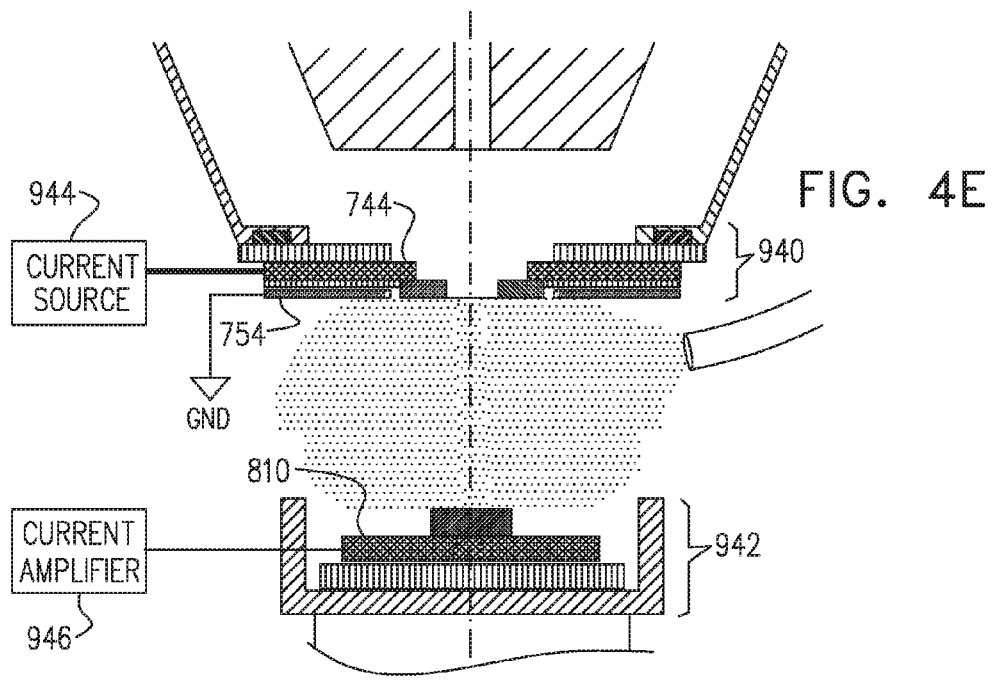

Turning to FIG. 4E, it is seen that the structure of the membrane holder 940 is similar to that shown in FIG. 2C and the structure of the sample holder 942 is similar to that shown in FIG. 3A. It is seen that the apertured disc 744 (FIG. 2C) operates as an electrode and is coupled to a current source 944. It is also seen that apertured disc 754 (FIG. 2C) operates as an additional electrode as is coupled to ground and that conductive disc 810 (FIG. 3A) operates as an output electrode and is coupled via a current amplifier 946 to detection circuitry (not shown).

Figure 4F:
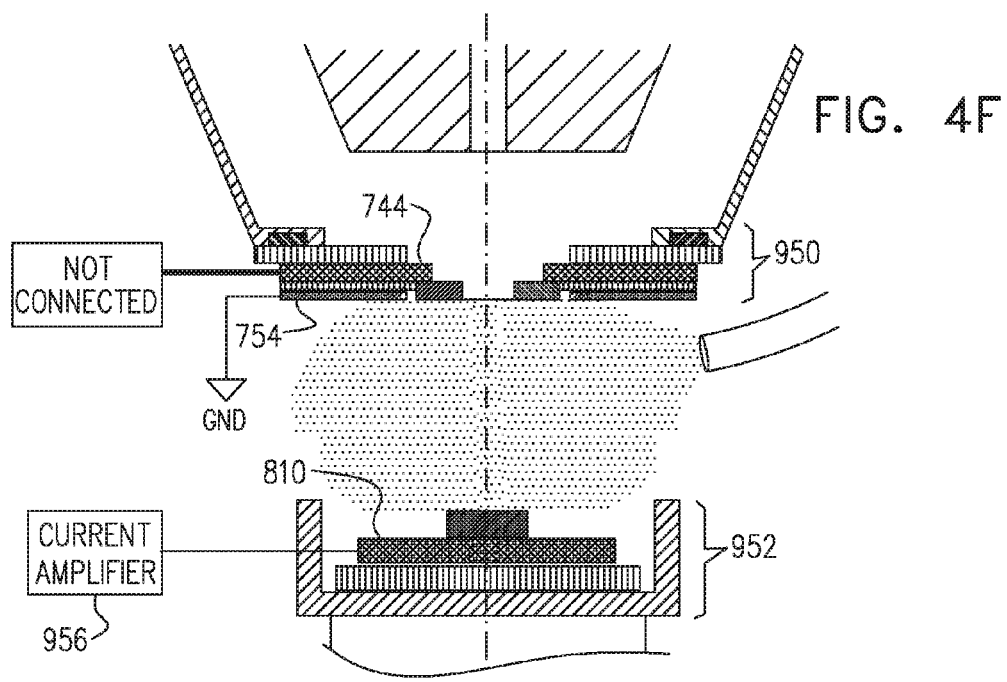

Turning to FIG. 4F, it is seen that the structure of the membrane holder 950 is similar to that shown in FIG. 2C and the structure of the sample holder 952 is similar to that shown in FIG. 3A. It is seen that the apertured disc 744 (FIG. 2C) is floating and is coupled neither to ground nor to a voltage or current source. It is also seen that apertured disc 754 (FIG. 2C) operates as an electrode as is coupled to ground and that conductive disc 810 (FIG. 3A) operates as an output electrode and is coupled via a current amplifier 956 to detection circuitry (not shown).

Figure 4G:
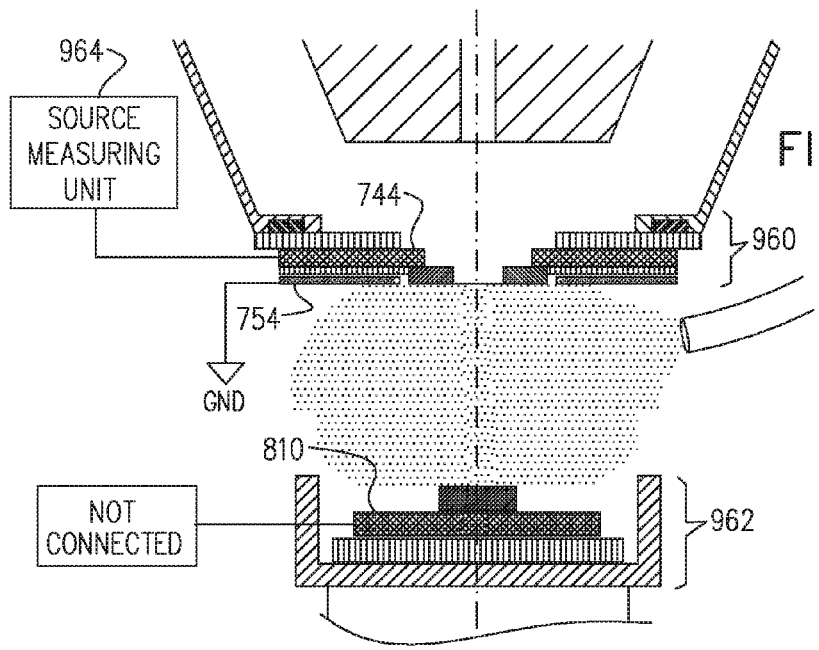

Turning to FIG. 4G, it is seen that the structure of the membrane holder 960 is similar to that shown in FIG. 2C and the structure of the sample holder 962 is similar to that shown in FIG. 3A. It is seen that the conductive disc 810 (FIG. 3A) is floating and is coupled neither to ground nor to a voltage or current source. It is also seen that apertured disc 754 (FIG. 2C) operates as an electrode as is coupled to ground and that apertured disc 744 operates as an output electrode and is coupled via a Source Measuring Unit (SMU) 964 to detection circuitry (not shown).

Figure 4H:
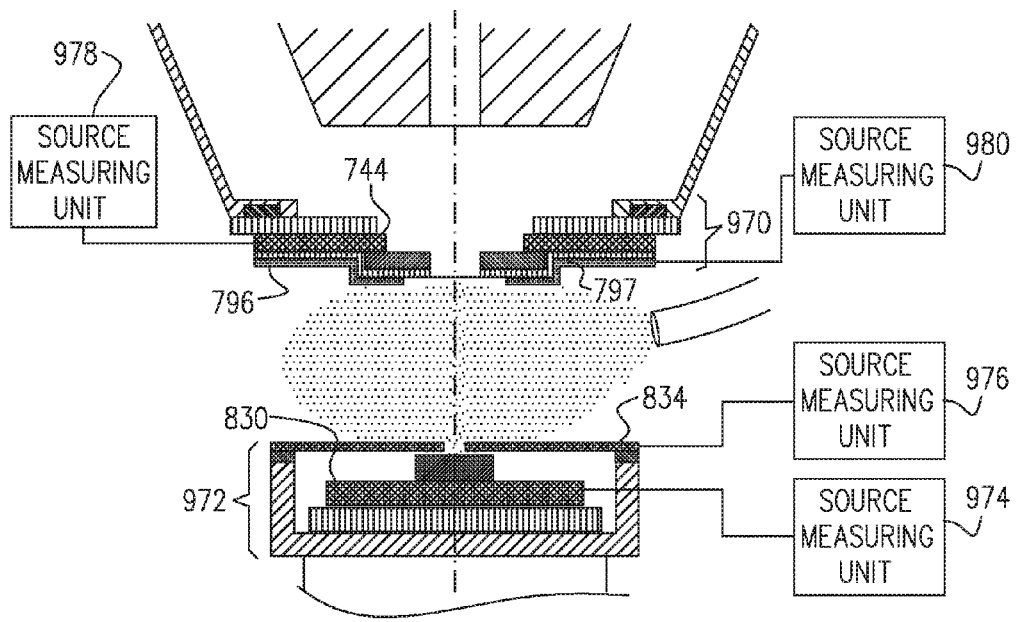

Turning to FIG. 4H, it is seen that the structure of the membrane holder 970 is similar to that shown in FIG. 2E and the structure of the sample holder 972 is similar to that shown in FIG. 3B. It is seen that the conductive disc 830 (FIG. 3B) operates as an electrode and is coupled via an SMU 974 to detection circuitry (not shown). It is also seen that apertured disc 834 also operates as an electrode and is coupled via an SMU 976 to detection circuitry (not shown). It is further seen that each of quadrants 796, 797, 798 and 799 (FIG. 2E) operates as an additional electrode and each is coupled via a separate SMU to detection circuitry (not shown). As seen in FIG. 4H, quadrant 796 is coupled to SMU 978 and quadrant 797 is coupled to SMU 980. Quadrants 798 and 799 are each coupled to a different SMU (not shown).

It will be appreciated by persons skilled in the art that the present invention is not limited to what has been particularly shown and described hereinabove. Rather the scope of the invention includes both combinations and subcombinations of the various features described hereinabove as well as modifications and variations thereof which would occur to persons skilled in the art upon reading the foregoing description and which are not in the prior art.

The invention claimed is:

1. A scanning electron microscope suitable for imaging samples in a non-vacuum environment, the scanning electron microscope comprising:
   an electron source located within an enclosure maintained under vacuum;
   an electron permeable membrane disposed at an opening of said enclosure separating an environment within said enclosure which is maintained under vacuum and an environment outside said enclosure which is not maintained under vacuum, said electron permeable membrane not being electrically grounded; and
   at least one non-grounded electrode operative as an electron detector.

2. A scanning electron microscope suitable for imaging samples in a non-vacuum environment, the scanning electron microscope comprising:
   an electron source located within an enclosure maintained under vacuum;
   an electron permeable membrane disposed at an opening of said enclosure separating an environment within said enclosure which is maintained under vacuum and an environment outside said enclosure which is not maintained under vacuum; and
   at least one non-grounded electrode operative as a support for said electron permeable membrane and functioning as part of an electron detector.

3. A scanning electron microscope suitable for imaging samples in a non-vacuum environment, the scanning electron microscope comprising:
   an electron source located within an enclosure maintained under vacuum;
   an electron permeable membrane disposed at an opening of said enclosure separating an environment within said enclosure which is maintained under vacuum and an environment outside said enclosure which is not maintained under vacuum;
   a first non-grounded electrode operative as a support for said electron permeable membrane and functioning as part of an electron detector; and
   a second non-grounded electrode operative associated with a sample support and functioning as part of an electron detector,
   a volume generally between said first and second electrodes generally being maintained at a positive pressure of less than 2 atmospheres.

4. A scanning electron microscope suitable for imaging samples in a non-vacuum environment, the scanning electron microscope comprising:
   an electron source located within an enclosure maintained under vacuum;
   an electron permeable membrane disposed at an opening of said enclosure separating an environment within said enclosure which is maintained under vacuum and an environment outside said enclosure which is not maintained under vacuum;
   an ionized gas generator operative to provide an ionized gas in said environment outside said enclosure; and
   at least one non-grounded electrode operative as an electron detector.

5. A scanning electron microscope suitable for imaging samples in a non-vacuum environment according to claim 1 and also comprising an ionized gas generator operative to provide an ionized gas in said environment outside said enclosure.

6. A scanning electron microscope suitable for imaging samples in a non-vacuum environment according to claim 4 and wherein said ionized gas forms a plasma.

7. A scanning electron microscope suitable for imaging samples in a non-vacuum environment according to claim 4 and wherein said ionized gas generator comprises at least one of an RF coil and an ionizing light source.

8. A scanning electron microscope suitable for imaging samples in a non-vacuum environment according to claim 4 and wherein said ionized gas generator comprises a humidifier.

9. A scanning electron microscope suitable for imaging samples in a non-vacuum environment according to claim 4 and wherein said ionized gas comprises humidified helium gas.

10. A scanning electron microscope suitable for imaging samples in a non-vacuum environment according to claim 9 and wherein said humidified helium gas has a relative humidity of at least 30% at 20° C.

11. A scanning electron microscope suitable for imaging samples in a non-vacuum environment according to claim 9 and wherein said humidified helium gas has a relative humidity of at least 50% at 20° C.

12. A scanning electron microscope suitable for imaging samples in a non-vacuum environment according to claim 9 and wherein said humidified helium gas has a relative humidity of at least 90% at 20° C.

13. A scanning electron microscope suitable for imaging samples in a non-vacuum environment according to claim 1 and wherein said at least one non-grounded electrode forms part of a support for said electron permeable membrane.

14. A scanning electron microscope suitable for imaging samples in a non-vacuum environment according to claim 1 and wherein said at least one non-grounded electrode is associated with a sample support.

15. A scanning electron microscope suitable for imaging samples in a non-vacuum environment according to claim 1 and wherein said at least one non-grounded electrode is coupled to at least one of a current source and a voltage source.

16. A scanning electron microscope suitable for imaging samples in a non-vacuum environment according to claim 1 and wherein said electron detector comprises at least one of a current amplifier and at least one Source Measuring Unit (SMU).

17. A scanning electron microscope suitable for imaging samples in a non-vacuum environment according to claim 2 and also comprising at least one additional non-grounded electrode associated with a sample support and functioning as part of an electron detector.

18. A scanning electron microscope suitable for imaging samples in a non-vacuum environment according to claim 17 and wherein at least one of said at least one non-grounded electrode and said at least one additional non-grounded electrode is coupled to at least one of a current source and a voltage source.

19. A scanning electron microscope suitable for imaging samples in a non-vacuum environment according to claim 3 and wherein at least one of said first non-grounded electrode and said second non-grounded electrode is coupled to at least one of a current source and a voltage source.

* * * * *